US 11,502,117 B2

(12) United States Patent
Ha et al.

(10) Patent No.: US 11,502,117 B2
(45) Date of Patent: Nov. 15, 2022

(54) IMAGE SENSOR INCLUDING CONDUCTIVE CONNECTION PATTERN

(71) Applicant: SAMSUNG ELECTRONICS CO., LTD., Suwon-si (KR)

(72) Inventors: Hyoun-Jee Ha, Hwaseong-si (KR); Changhwa Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 204 days.

(21) Appl. No.: 16/900,072

(22) Filed: Jun. 12, 2020

(65) Prior Publication Data

US 2021/0143191 A1 May 13, 2021

(30) Foreign Application Priority Data

Nov. 8, 2019 (KR) .................. 10-2019-0142668

(51) Int. Cl.
*H01L 27/146* (2006.01)

(52) U.S. Cl.
CPC .... *H01L 27/14603* (2013.01); *H01L 27/1463* (2013.01); *H01L 27/14636* (2013.01); *H01L 27/14689* (2013.01); *H01L 27/14614* (2013.01)

(58) Field of Classification Search
CPC ........... H01L 27/14603; H01L 27/1463; H01L 27/14636; H01L 27/14689; H01L 27/14614; H01L 27/1464; H01L 27/14641; H01L 27/14612; H01L 27/14605; H01L 27/14683
See application file for complete search history.

(56) References Cited

U.S. PATENT DOCUMENTS

| | | |
|---|---|---|
| 7,859,027 B2 | 12/2010 | Uya |
| 8,278,614 B2 | 10/2012 | Han |
| 8,941,204 B2 | 1/2015 | Lin et al. |
| 8,981,516 B2 | 3/2015 | Prima et al. |
| 9,006,807 B2 | 4/2015 | Inoue et al. |
| 9,041,073 B2 | 5/2015 | Ahn et al. |
| 9,609,250 B2 | 3/2017 | Lee et al. |
| 9,780,142 B1 | 10/2017 | Koo et al. |
| 10,170,517 B2 | 1/2019 | Lee et al. |
| 10,586,824 B2 | 3/2020 | Kim et al. |

(Continued)

FOREIGN PATENT DOCUMENTS

| | | |
|---|---|---|
| CN | 109728013 | 5/2019 |
| KR | 1020210044364 | 4/2021 |
| WO | 2014021115 | 2/2014 |

*Primary Examiner* — Douglas W Owens
(74) *Attorney, Agent, or Firm* — F. Chau & Associates, LLC

(57) ABSTRACT

An image sensor includes a substrate having a first surface and a second surface facing each other, a plurality of photoelectric conversion regions disposed in the substrate, an isolation pattern disposed in the substrate between the photoelectric conversion regions, a conductive connection pattern disposed on the isolation pattern and in a trench penetrating the first surface of the substrate, and a first impurity region disposed in the substrate and adjacent to the first surface of the substrate. A first sidewall of the conductive connection pattern is in contact with the first impurity region. A dopant included in the conductive connection pattern includes the same element as an impurity doped in the first impurity region.

20 Claims, 31 Drawing Sheets

(56) References Cited

U.S. PATENT DOCUMENTS

| | | |
|---|---|---|
| 2015/0187826 A1 | 7/2015 | Suzuki |
| 2016/0111467 A1* | 4/2016 | Tanaka .............. H01L 27/14645 |
| | | 438/80 |
| 2018/0190694 A1 | 7/2018 | Ihara |
| 2020/0219912 A1* | 7/2020 | Ro .................... H01L 27/14612 |
| 2021/0111202 A1* | 4/2021 | Ha ...................... H01L 27/1463 |
| 2021/0210537 A1* | 7/2021 | Hsieh ................. H01L 27/1463 |

* cited by examiner

IMAGE SENSOR INCLUDING CONDUCTIVE CONNECTION PATTERN

CROSS-REFERENCE TO RELATED APPLICATIONS

This application claims priority under 35 U.S.C. § 119 to Korean Patent Application No. 10-2019-0142668, filed on Nov. 8, 2019 in the Korean Intellectual Property Office, the disclosure of which is incorporated by reference herein in its entirety.

TECHNICAL FIELD

Exemplary embodiments of the present inventive concept relate to an image sensor, and more particularly, to an image sensor in which an electrical connection is provided between components of pixel regions included in the image sensor.

DISCUSSION OF THE RELATED ART

An image sensor is a device that converts optical images into electrical signals. An image sensor may be classified as a charge coupled device (CCD) type or a complementary metal oxide semiconductor (CMOS) type. A CMOS type image sensor may be abbreviated as CIS (CMOS image sensor). A CIS has a plurality of two-dimensionally arranged pixels. Each of the pixels includes a photodiode, which serves to convert incident light into electrical signals.

SUMMARY

Exemplary embodiments of the present inventive concept provide a compact-sized image sensor.

According to exemplary embodiments, an image sensor includes a substrate having a first surface and a second surface facing each other, a plurality of photoelectric conversion regions disposed in the substrate, an isolation pattern disposed in the substrate between the photoelectric conversion regions, a conductive connection pattern disposed on the isolation pattern and in a trench penetrating the first surface of the substrate, and a first impurity region disposed in the substrate and adjacent to the first surface of the substrate. A first sidewall of the conductive connection pattern is in contact with the first impurity region. A dopant included in the conductive connection pattern includes the same element as an impurity doped in the first impurity region.

According to exemplary embodiments, an image sensor includes a substrate having a first surface and a second surface facing each other, an isolation pattern penetrating the substrate and defining a plurality of pixel regions, a conductive connection pattern disposed in a trench penetrating the first surface of the substrate, the conductive connection pattern disposed on the isolation pattern, and a plurality of impurity regions disposed in the substrate and adjacent to the first surface of the substrate. The impurity regions include a first impurity region in contact with a first sidewall of the conductive connection pattern, and a second impurity region in contact with a second sidewall of the conductive connection pattern. The second sidewall faces the first sidewall, and the conductive connection pattern includes a doped semiconductor material.

According to exemplary embodiments, an image sensor includes a substrate having a first surface and a second surface facing each other, an isolation pattern defining a first pixel region and a second pixel region in the substrate, a photoelectric conversion region disposed in each of the first and second pixel regions in the substrate, a first impurity region disposed in the first pixel region of the substrate and adjacent to the first surface of the substrate, and a second impurity region disposed in the second pixel region of the substrate and adjacent to the first surface of the substrate. The image sensor further includes a conductive connection pattern disposed between the first impurity region and the second impurity region, the conductive connection pattern disposed in a trench penetrating the first surface of the substrate, a gate pattern disposed on the first surface of the substrate and spaced apart from the conductive connection pattern, a gate dielectric pattern disposed between the substrate and the gate pattern, and an interconnection layer disposed on the first surface of the substrate, the interconnection layer including a plurality of dielectric layers and a wiring structure. The image sensor further includes a color filter disposed on the second surface of the substrate, and a micro-lens disposed on the color filter. The isolation pattern includes a dielectric isolation pattern and a conductive isolation pattern disposed in the dielectric isolation pattern. The conductive connection pattern vertically overlaps the conductive isolation pattern. The conductive connection pattern is in physical contact with and is electrically connected to the first impurity region and the second impurity region.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
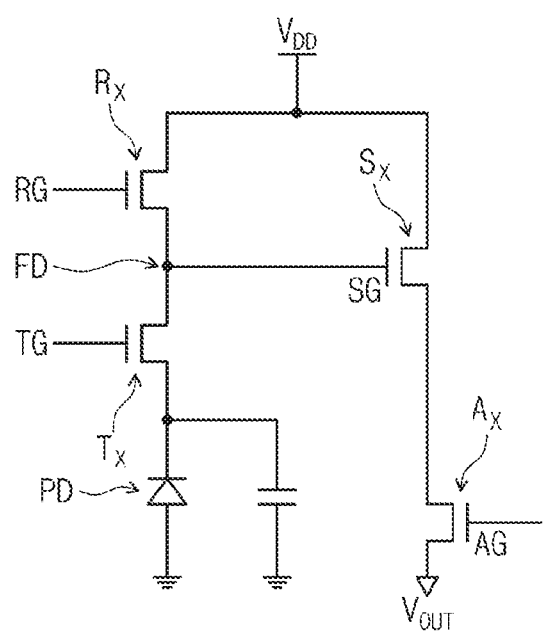
FIG. 1 illustrates a circuit diagram showing a pixel of an image sensor according to exemplary embodiments.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Further, when two components or directions are described as being substantially parallel or perpendicular to each other, it is to be understood that the two directions are exactly parallel or perpendicular to each other, or are approximately parallel or perpendicular to each other within a measurement error as would be understood by a person having ordinary skill in the art. Other uses of the words "about" and "substantially" should be construed in a like fashion.

FIG. 1 illustrates a circuit diagram showing a pixel of an image sensor according to exemplary embodiments.

Referring to FIG. 1, each of pixels of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes an n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax. For example, a drain electrode/region of the source follower transistor Sx may correspond to a source electrode/region of the selection transistor Ax.

An operation of the image sensor will be explained below with reference to FIG. 1.

First, a power voltage $V_{DD}$ may be applied to a drain of the reset transistor Rx and a drain of the source follower transistor Sx under a light-blocked state, such that the reset transistor Rx may be turned on to discharge charges that remain on the floating diffusion region FD. Thereafter, when the reset transistor Rx is turned off and external light is incident onto the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and holes may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

FIG. 1 exemplarily shows a pixel that includes one photoelectric conversion region PD and four transistors TX, RX, AX, and Sx. However, the present inventive concept is not limited thereto. For example, the pixel may be provided in plural, and neighboring pixels may share one of the reset transistor Rx, the source follower transistor Sx, and the selection transistor Ax. Therefore, an image sensor may increase in integration.

Figure 2A:
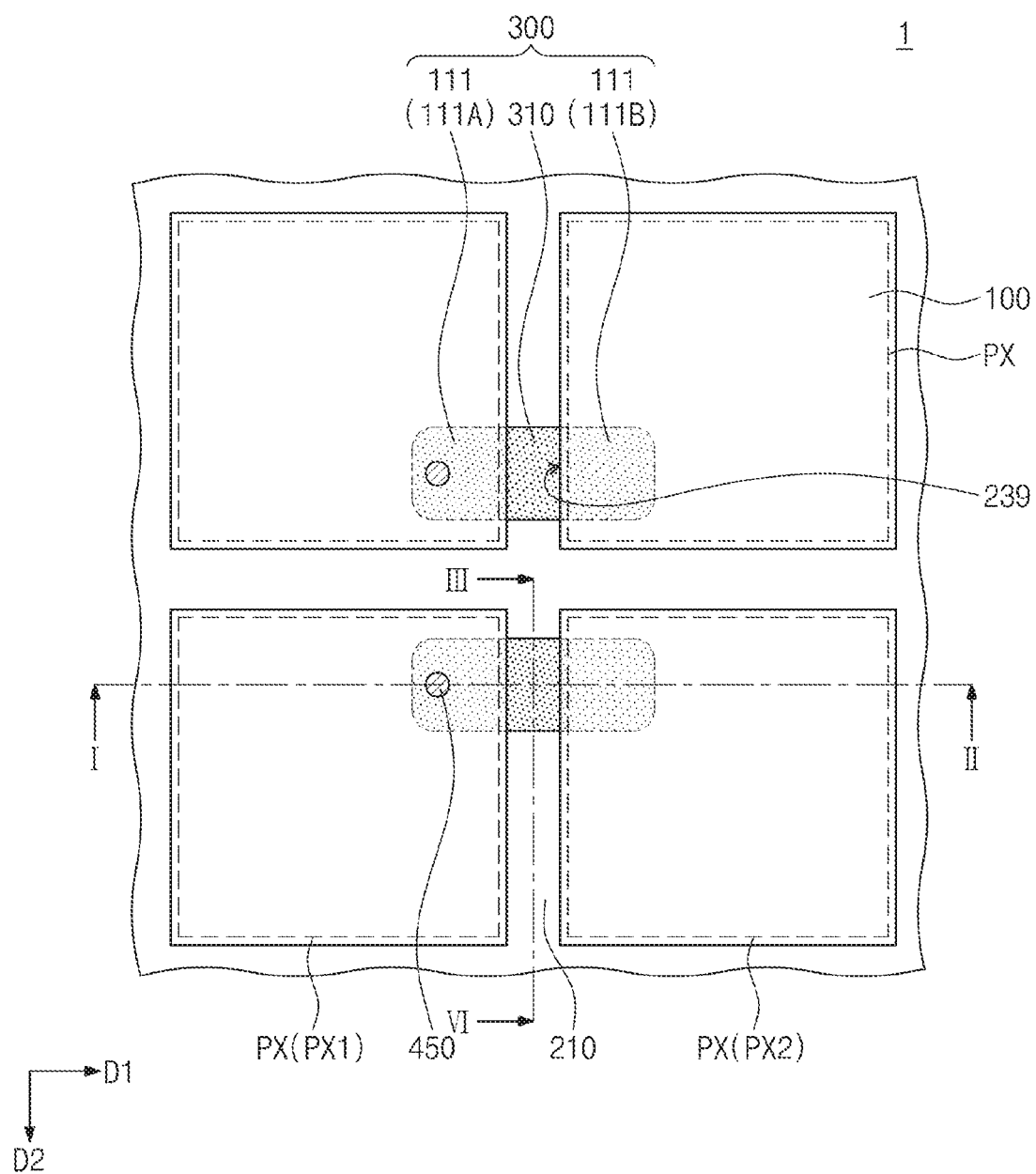
FIG. 2A illustrates a plan view showing an image sensor according to exemplary embodiments.
Figure 2B:
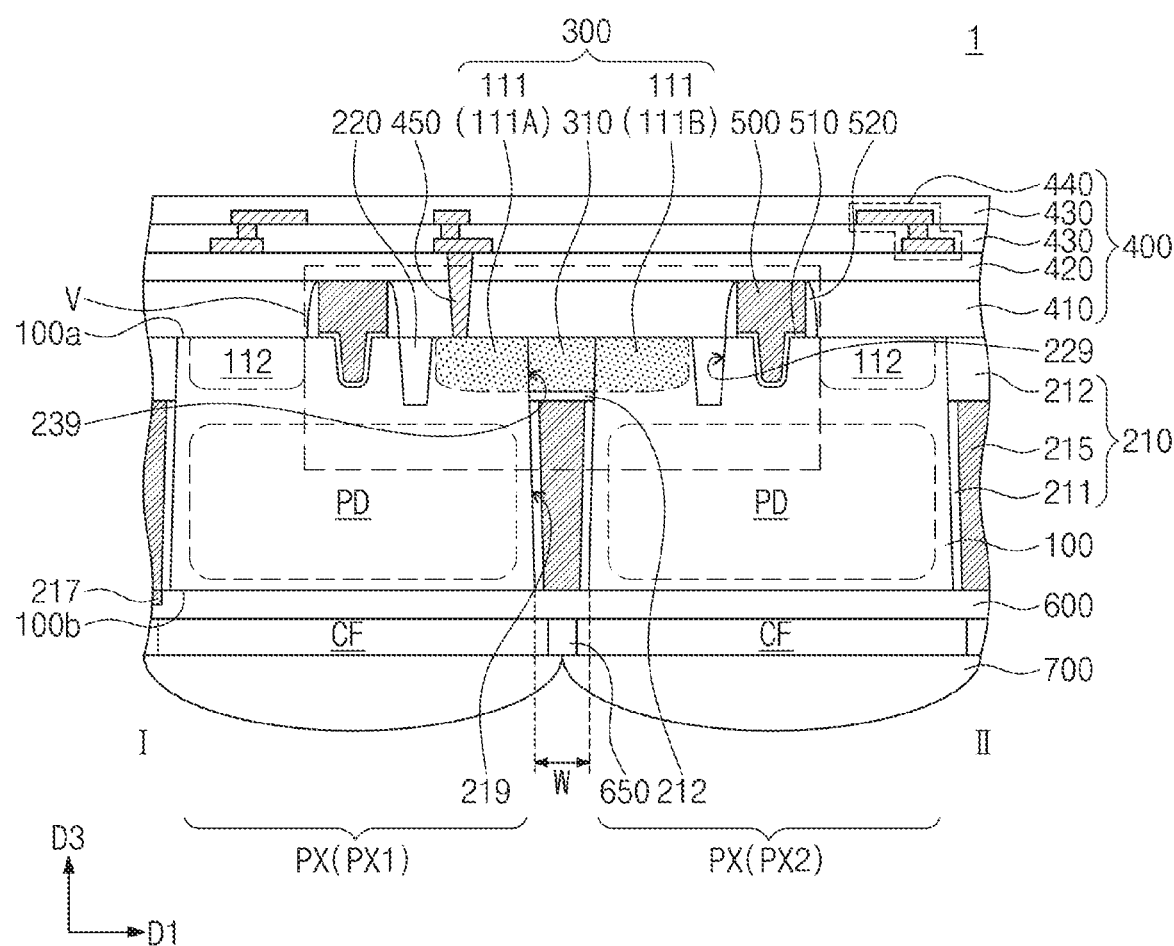
FIG. 2B illustrates a cross-sectional view taken along line I-II of FIG. 2A.
Figure 2C:
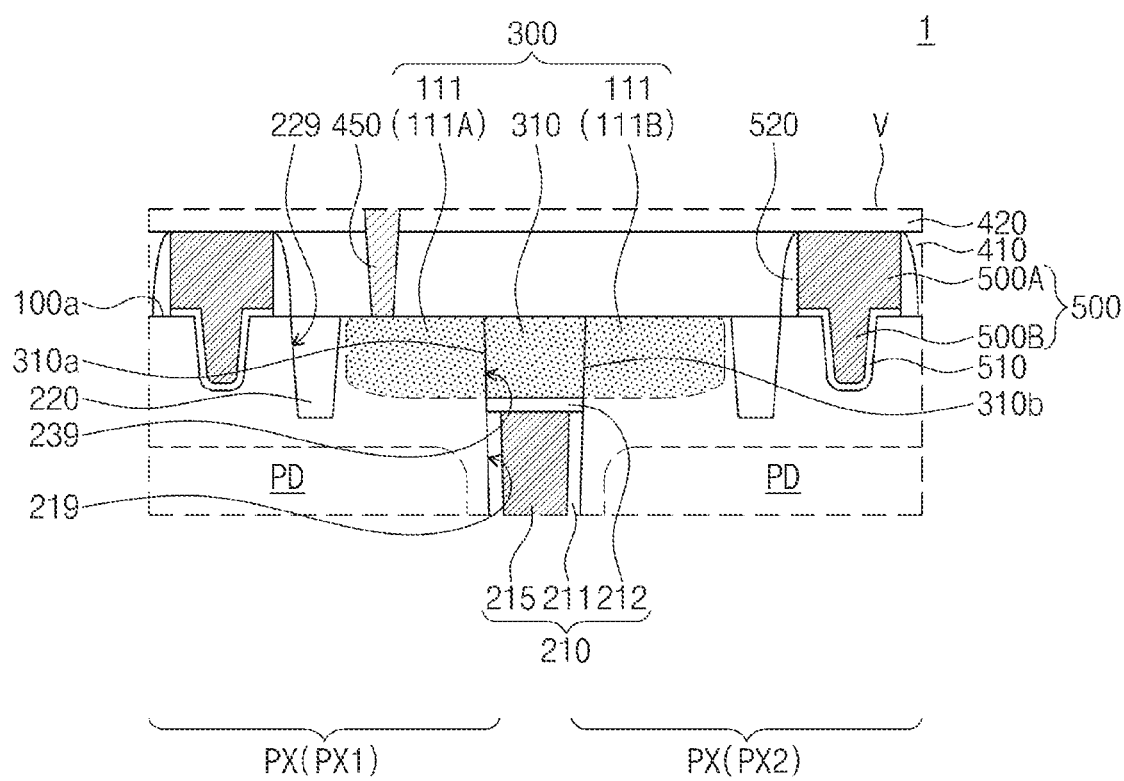
FIG. 2C illustrates an enlarged view showing section V of FIG. 2B.
Figure 2D:
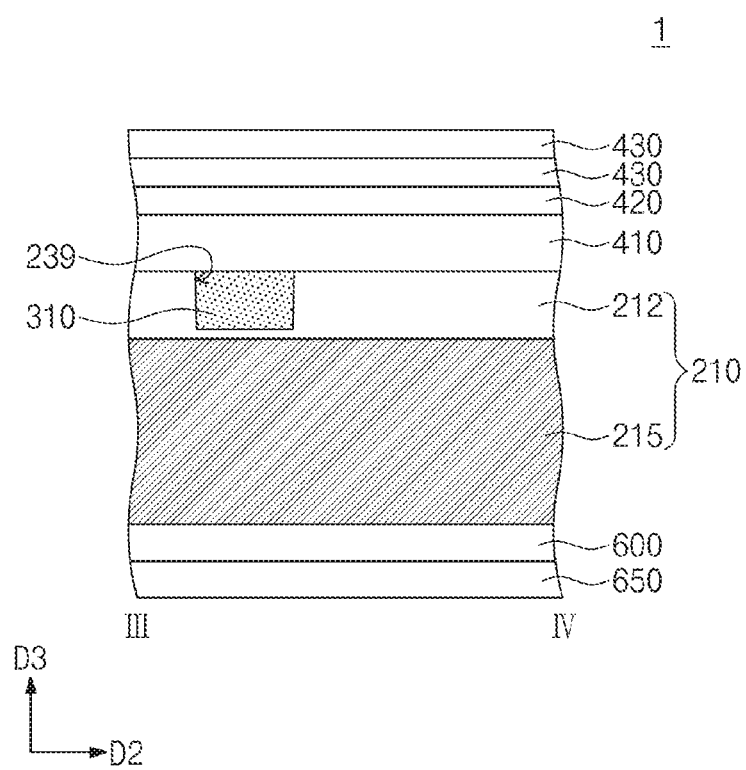
FIG. 2D illustrates a cross-sectional view taken along line III-IV of FIG. 2A.

FIG. 2A illustrates a plan view showing an image sensor according to exemplary embodiments. FIG. 2B illustrates a cross-sectional view taken along line I-II of FIG. 2A. FIG. 2C illustrates an enlarged view showing section V of FIG. 2B. FIG. 2D illustrates a cross-sectional view taken along line III-IV of FIG. 2A. For convenience of explanation, a further description of elements and technical aspects previously described may be omitted below.

Referring to FIGS. 2A to 2D, an image sensor 1 may include a substrate 100, an isolation pattern 210, a device dielectric pattern 220, a conductive connection pattern 310, a gate pattern 500, and an interconnection layer 400. The conductive connection pattern 310 may include a doped semiconductor material. The substrate 100 may have a plurality of pixel regions PX. The pixel described with reference to FIG. 1 may be formed in each of the pixel regions PX of the substrate 100. For example, components of the pixel may be provided in each of the pixel regions PX. In a plan view, the pixel regions PX may include a first pixel region PX1 and a second pixel region PX2. The first pixel region PX1 may neighbor the second pixel region PX2, and the first and second pixel regions PX1 and PX2 may be spaced apart from each other in a second direction D2 crossing a first direction D1, or in a direction opposite to the second direction D2 crossing the first direction D1. The first pixel region PX1 and the second pixel region PX2 may be defined by the isolation pattern 210. For example, the isolation pattern 210 may be disposed between the first pixel region PX1 and the second pixel region PX2, which may be adjacent to each other and separated from each other by the isolation pattern 210. The substrate 100 may have a first surface 100a and a second surface 100b facing each other. For example, the first surface 100a and the second surface 100b may face each other in a third direction D3. The third direction D3 may extend substantially perpendicular to the first direction D1 and the second direction D2, and may correspond to, for example, a depth direction of the image sensor 1. The first surface 100a of the substrate 100 may be a front surface, and the second surface 100b of the substrate 100 may be a rear surface. For example, the substrate 100 may be a semiconductor substrate or a silicon-on-insulator (SOI) substrate. The semiconductor substrate may include, for example, a silicon substrate, a germanium substrate, or a silicon-germanium substrate. The substrate 100 may include first conductive type impurities. For example, the first conductive type impurities may include p-type impurities, such as aluminum (Al), boron (B), indium (In), and/or gallium (Ga). In this description, the impurities may denote dopants.

Photoelectric conversion regions PD may be disposed on corresponding pixel regions PX in the substrate 100. The photoelectric conversion regions PD may have the same function and role as those of the photoelectric conversion region PD shown in FIG. 1. The photoelectric conversion regions PD may be areas doped with second conductive type impurities. The second conductive type impurities may have a conductive type different from that of the first conductive type impurities. The second conductive type impurities may include n-type impurities, such as phosphorus, arsenic, bismuth, and/or antimony. The photoelectric conversion regions PD may be located deep below the first surface 100a of the substrate 100. In exemplary embodiments, the photoelectric conversion regions PD may be disposed entirely within the substrate 100. For example, the photoelectric conversion regions PD may be embedded within the substrate 100 between the first surface 100a and the second surface 100b.

Impurity regions 111 may be disposed on corresponding pixel regions PX. In the substrate 100, the impurity regions 111 may be adjacent to the first surface 100a of the substrate 100. The impurity regions 111 may have their bottom surfaces spaced apart from the photoelectric conversion regions PD. The impurity regions 111 may be doped areas. The impurity regions 111 may include the first conductive type impurities. The impurity regions 111 may be ground regions. The impurity regions 111 may include impurities, for example, the first conductive type impurities, whose conductive type is the same as that of the substrate 100. The impurity concentrations of the impurity regions 111 may be greater than that of impurities doped in the substrate 100.

The impurity regions 111 of two adjacent pixel regions PX may be disposed symmetrically with each other. The impurity regions 111 may include a first impurity region 111A and a second impurity region 111B. In exemplary embodiments, each of the first impurity region 111A and the second impurity region 111B may include a ground region. In exemplary embodiments, each of the first impurity region 111A and the second impurity region 111B may include a floating diffusion region. The first impurity region 111A may be provided in the first pixel region PX1, and the second impurity region 111B may be provided in the second pixel region PX2. The first impurity region 111A may be disposed symmetrically with the second impurity region 111B. The first impurity region 111A and the second impurity region 111B may be disposed adjacent to the first surface 100a of the substrate 100. In exemplary embodiments, the first impurity region 111A and the second impurity region 111B may be disposed directly adjacent to the first surface 100a (e.g., no intervening layers or elements may be disposed between the first impurity region 111A and the first surface 100a and between the second impurity region 111B and the first surface 100a).

Doping regions 112 may be disposed on corresponding pixel regions PX in the substrate 100. In the substrate 100, the doping regions 112 may be adjacent to the first surface 100a of the substrate 100. The doping regions 112 may have their bottom surfaces spaced apart from the photoelectric conversion regions PD. The doping regions 112 may include the second conductive type impurities.

Each of the doping regions 112 may be an active region. The active region may indicate a zone for the operation of a transistor, and may include source/drain regions of the transistor and the floating diffusion region FD described with reference to FIG. 1. The transistor may include one of the transfer transistor Tx, the source/follower transistor Sx, the reset transistor Rx, and the selection transistor Ax that are described with reference to FIG. 1.

The device dielectric pattern 220 may be provided in the substrate 100. The device dielectric pattern 220 may be provided in a first trench 229, and the first trench 229 may be recessed from the first surface 100a of the substrate 100. The device dielectric pattern 220 may be a shallow trench isolation (STI) layer. The device dielectric pattern 220 may have a bottom surface provided in the substrate 100. The device dielectric pattern 220 may be disposed on a side of one of the impurity region 111 and the doping region 112 in the substrate 100. The device dielectric pattern 220 may define the active region or the ground region. For example, in each of the pixel regions PX, the device dielectric pattern 220 may define the impurity region 111 or the doping region 112, and the doping region 112 and the device dielectric pattern 220 may separate the impurity regions 111 from each other. When a plurality of doping regions 112 are provided on at least one of the pixel regions PX, the device dielectric pattern 220 may separate the doping regions 112 from each other. The device dielectric pattern 220 may include, for example, one or more of silicon oxide, silicon nitride, and silicon oxynitride.

The isolation pattern 210 may be provided in the substrate 100 and may define the pixel regions PX. For example, the isolation pattern 210 may be provided between the pixel regions PX of the substrate 100. The isolation pattern 210 may be provided in the second trench 219, and the second trench 219 may be recessed from the first surface 100a of the substrate 100. The second trench 219 may penetrate the first surface 100a of the substrate 100. The isolation pattern 210 may be a deep trench isolation (DTI) layer. The isolation pattern 210 may have a bottom surface at a lower level than that of the bottom surface of the device dielectric pattern 220. The bottom surface of the isolation pattern 210 may be coplanar with or adjacent to the second surface 100b of the substrate 100. For example, the isolation pattern 210 may penetrate the second surface 100b of the substrate 100. The isolation pattern 210 may have a width on its top surface greater than a width W on its bottom surface. The width W at the bottom surface of the isolation pattern 210 may range from about 0.03 μm to about 0.08 μm. For example, the width W of the isolation pattern 210 at the second surface 100b of the substrate 100 may be between about 0.03 μm and about 0.08 μm. The isolation pattern 210 may be disposed in the substrate 100 between adjacent photoelectric conversion regions PD.

The isolation pattern 210 may include a first dielectric isolation pattern 211, a second dielectric isolation pattern 212, and a conductive isolation pattern 215. The first dielectric isolation pattern 211 may be provided along a sidewall of the second trench 219. In exemplary embodiments, the first dielectric isolation pattern 211 does not extend onto an upper portion of the second trench 219. The first dielectric isolation pattern 211 may include, for example, one or more of a silicon-based dielectric material and a high-k dielectric material. In this description, the silicon-based dielectric material may include, for example, one or more of silicon nitride, silicon oxide, and silicon oxynitride. In this description, the high-k dielectric material may include, for example, one or more of hafnium oxide and aluminum oxide. The first dielectric isolation pattern 211 may include a plurality of layers that include different materials from each other. The first dielectric isolation pattern 211 may have a refractive index less than that of the substrate 100. Accordingly, a crosstalk phenomenon may be prevented or reduced between the pixel regions PX of the substrate 100.

The conductive isolation pattern 215 may be provided in the first dielectric isolation pattern 211. For example, the conductive isolation pattern 215 may have a sidewall surrounded by the first dielectric isolation pattern 211. The first dielectric isolation pattern 211 may be interposed between the conductive isolation pattern 215 and the substrate 100. Therefore, when the image sensor 1 operates, the conductive isolation pattern 215 may be electrically separated from the substrate 100. The conductive isolation pattern 215 may include a crystalline semiconductor material, such as polysilicon. For example, the conductive isolation pattern 215 may include doped polysilicon. The conductive isolation pattern 215 may further include dopants, and the dopants may be the first or second conductive type impurities.

In the second trench 219, the second dielectric isolation pattern 212 may be provided on a top surface of the first dielectric isolation pattern 211 and on a top surface of the conductive isolation pattern 215. The second dielectric isolation pattern 212 may include, for example, one or more of a silicon-based dielectric material and a high-k dielectric material. The second dielectric isolation pattern 212 may have a refractive index less than that of the substrate 100. In exemplary embodiments, the first dielectric isolation pattern 211 and the second dielectric isolation pattern 212 may be collectively referred to as a dielectric isolation pattern. Thus, a dielectric isolation pattern may be referred to as being disposed on a sidewall and a top surface of the conductive isolation pattern 215. In exemplary embodiments, the second dielectric isolation pattern 212 may be disposed between the conductive connection pattern 310 and the conductive isolation pattern 215, thus electrically insulating the conductive connection pattern 310 from the conductive isolation pattern 215.

The second surface 100b of the substrate 100 may be provided thereon with a conductive terminal 217 connected to the conductive isolation pattern 215. For example, the conductive terminal 217 may be provided on or outside a certain one of the pixel regions PX. The certain one of the pixel regions PX may be an outermost pixel region. The conductive terminal 217 may receive a first voltage. The first voltage may be, for example, a negative bias voltage. The first voltage may be applied through the conductive terminal 217 to the conductive isolation pattern 215. In this configuration, electrons (e.g., noise electrons) generated due to interface defects between the isolation pattern 210 and the substrate 100 may be removed when the image sensor 1 operates. The interface defects may be provided, for example, on the sidewall of the second trench 219. The removal of the interface defects may increase an image quality of the image sensor 1.

The conductive connection pattern 310 may be provided in the substrate 100. The conductive connection pattern 310 may be provided in a third trench 239, and the third trench 239 may be recessed from the first surface 100a of the substrate 100. As shown in FIG. 2D, the third trench 239 may be disposed in the second dielectric isolation pattern 212. The conductive connection pattern 310 may have a top surface at substantially the same level as that of the first surface 100a of the substrate 100 and that of a top surface of the second dielectric isolation pattern 212. For example, the top surface of the conductive connection pattern 310, the first surface 100a of the substrate 100, and the top surface of the second dielectric isolation pattern 212 may be substantially coplanar. The conductive connection pattern 310 may have a width on its top surface greater than a width on its bottom surface. The conductive connection pattern 310 may have a length on its top surface greater than a length on its bottom surface. In a plan view, as shown in FIG. 2A, the conductive connection pattern 310 may overlap the isolation pattern 210. As shown in FIG. 2B, the conductive connection pattern 310 may be disposed on the isolation pattern 210 and may be disposed in the third trench 239, which penetrates the first surface 100a of the substrate 100. As shown in FIG. 2B, the conductive connection pattern 310 may vertically overlap the conductive isolation pattern 215. For example, the conductive connection pattern 310 may overlap the conductive isolation pattern 215 in the third direction D3 (e.g., in the depth direction of the image sensor 1). The second dielectric isolation pattern 212 may be interposed between the conductive isolation pattern 215 and the conductive connection pattern 310. The second dielectric isolation pattern 212 may electrically separate the conductive connection pattern 310 from the conductive isolation pattern 215.

The conductive connection pattern 310 may be provided between the impurity regions 111 of two adjacent pixel regions PX. For example, the conductive connection pattern 310 may be interposed between the first pixel region PX1 and the second pixel region PX2. As shown in FIG. 2C, the conductive connection pattern 310 may have a first sidewall 310a and a second sidewall 310b facing each other. The first sidewall 310a of the conductive connection pattern 310 may be in contact (e.g., direct contact) with the first impurity region 111A. The second sidewall 310b of the conductive connection pattern 310 may be in contact (e.g., direct contact) with the second impurity region 111B. The conductive connection pattern 310 may be electrically connected to the first impurity region 111A and the second impurity region 111B.

The conductive connection pattern 310 may include a crystalline semiconductor material and dopants. In exemplary embodiments, the conductive connection pattern 310 may include doped polysilicon. The dopants included in the conductive connection pattern 310 may have the same conductive type as that of impurities doped in the impurity regions 111. The dopants included in the conductive connection pattern 310 may be the same element as that of impurities doped in the impurity regions 111. For example, the dopants included in the conductive connection pattern 310 may be the same element as that of impurities doped in the first impurity region 111A and that of impurities doped in the second impurity region 111B. The conductive connection pattern 310 may have a doping concentration the same as or different from that of the impurity region 111. A doping depth of the conductive connection pattern 310 may be the same as a depth of the impurity region 111. Alternatively, the doping depth of the conductive connection pattern 310 may be different from the depth of the impurity region 111. In exemplary embodiments, the conductive connection pattern 310 may include a metallic material.

The gate pattern 500 may be disposed on the first surface 100a of the substrate 100. In a plan view, in exemplary embodiments, the gate pattern 500 does not overlap the isolation pattern 210. The gate pattern 500 may serve as a gate electrode of one of the transfer transistor Tx, the source follower transistor Sx, the reset transistor Rx, and the selection transistor Ax that are described with reference to FIG. 1. For example, the gate pattern 500 may include one of the transfer gate TG, the source follower gate SG, the reset gate RG, and the selection gate AG. For brevity of illustration, FIGS. 2A to 2C show that a single gate pattern 500 is disposed in each of the pixel regions PX. However, the present inventive concept is not limited thereto. For example, in exemplary embodiments, a plurality of gate patterns 500 may be disposed in each of the pixel regions PX. A single gate pattern 500 will be described below for simplification of description.

The gate pattern 500 may have a buried gate structure. For example, as shown in FIG. 2C, the gate pattern 500 may include a first part 500A and a second part 500B. The first part 500A of the gate pattern 500 may be disposed on the first surface 100a of the substrate 100. The first part 500A of the gate pattern 500 may extend in a direction substantially parallel to the first surface 100a of the substrate 100. The second part 500B of the gate pattern 500 may protrude into the substrate 100. The second part 500B of the gate pattern 500 may be connected to the first part 500A of the gate pattern 500. The gate pattern 500 may include, for example, metal, metal silicide, polysilicon, or any combination thereof. A gate dielectric pattern 510 may be interposed between the gate pattern 500 and the substrate 100. The gate dielectric pattern 510 may include, for example, one or more of a silicon-based dielectric material and a high-k dielectric material. On the first surface 100a of the substrate 100, a gate spacer 520 may cover a sidewall of the first part 500A of the gate pattern 500. The gate spacer 520 may include semiconductor nitride, such as, for example, silicon nitride, silicon carbonitride, or silicon oxynitride.

The interconnection layer 400 may be disposed on the first surface 100a of the substrate 100. The interconnection layer 400 may include a first dielectric layer 410, a second dielectric layer 420, third dielectric layers 430, and a wiring structure 440. The first dielectric layer 410 may cover the first surface 100a of the substrate 100, the conductive connection pattern 310, and the gate spacer 520. The second dielectric layer 420 may be provided on a top surface of the first dielectric layer 410. The second dielectric layer 420 may be a multi-layer. Alternatively, the second dielectric layer 420 may be omitted. The third dielectric layers 430 may be stacked on the second dielectric layer 420. The first, second, and third dielectric layers 410, 420, and 430 may include a silicon-based dielectric material, such as, for example, silicon oxide, silicon nitride, and/or silicon oxynitride. The wiring structure 440 may include a via and wiring patterns. The wiring patterns may be interposed between the first, second, and third dielectric layers 410, 420, and 430. The via may penetrate the second dielectric layer 420 or at least one of the third dielectric layers 430, and may be connected to the wiring patterns. The wiring structure 440 may be electrically connected to one or more of the gate pattern 500, the impurity regions 111, and the doping regions 112.

A contact plug 450 may be provided in the first dielectric layer 410, and the contact plug 450 may penetrate the first dielectric layer 410. The contact plug 450 may further penetrate the second dielectric layer 420. The contact plug 450 may include a conductive material, such as metal. When the conductive connection pattern 310 is omitted, a plurality of contact plugs 450 may be correspondingly coupled to the first impurity region 111A and the second impurity region 111B. For example, the total number of the contact plugs 450 may be the same as that of the pixel regions PX. In this case, the contact plugs 450 may denote contact plugs that are electrically connected to the impurity regions 111.

According to exemplary embodiments, a share structure 300 may be constituted by the conductive connection pattern 310, the first impurity region 111A, and the second impurity region 111B. A single contact plug 450 may be disposed on one of the first impurity region 111A, the second impurity region 111B, and the conductive connection pattern 310. For example, in exemplary embodiments, the contact plug 450 may be provided on the first impurity region 111A, but is not disposed on the second impurity region 111B or the conductive connection pattern 310. The single contact plug 450 may be provided as an electrical path of the first impurity region 111A, the second impurity region 111B, and the conductive connection pattern 310. When the image sensor 1 operates, a second voltage may be applied through the contact plug 450 to the first impurity region 111A, the second impurity region 111B, and the conductive connection pattern 310. The second voltage may be a ground voltage and different from the first voltage. The share structure 300 may be provided such that the total number of the contact plugs 450 is less than that of the pixel regions PX. Therefore, the contact plugs 450 may increase in the degree of placement, and the image sensor 1 may decrease in size. Thus, the width W at the bottom surface of the isolation pattern 210 may range from about 0.03 µm to about 0.08 µm. This is because when the width W at the bottom surface of the isolation pattern 210 is greater than about 0.08 µm, it may be difficult to reduce the size of the image sensor 1, and when the width W at the bottom surface of the isolation pattern 210 is less than about 0.03 µm, it may be insufficient to separate the pixel regions PX from each other and/or it may be complicated to form the isolation pattern 210.

In exemplary embodiments, the contact plug 450 may be disposed on one of the conductive connection pattern 310, the first impurity region 111A, and the second impurity region 111B, and the contact plug 450 may be electrically connected to the conductive connection pattern 310, the first impurity region 111A, and the second impurity region 111B.

Figure 2E:
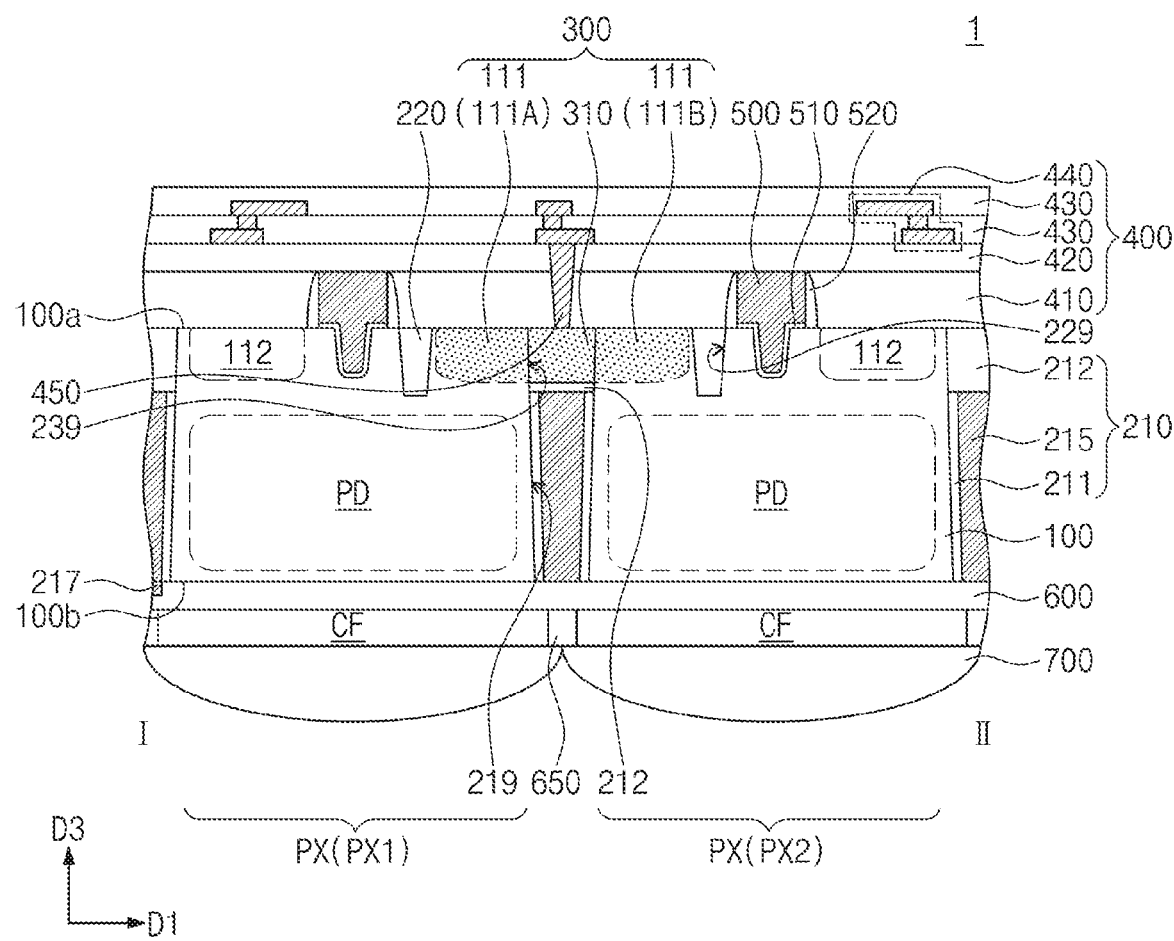
FIG. 2E illustrates a cross-sectional view taken along line I-II of FIG. 2A, showing an image sensor according to exemplary embodiments.

FIG. 2E illustrates a cross-sectional view taken along line I-II of FIG. 2A, showing a contact plug of an image sensor according to exemplary embodiments. For convenience of explanation, a further description of elements and technical aspects previously described may be omitted below.

Referring to FIG. 2E, on the conductive connection pattern 310, the contact plug 450 of the image sensor 1 may penetrate the first dielectric layer 410. The contact plug 450 may be directly coupled to the conductive connection pattern 310. In exemplary embodiments, the contact plug 450 is not disposed on the first impurity region 111A or the second impurity region 111B. The second voltage may be applied through a single contact plug 450 and the conductive connection pattern 310 to the first impurity region 111A and the second impurity region 111B.

The substrate 100, the isolation pattern 210, the device dielectric pattern 220, the conductive connection pattern 310, the gate pattern 500, and the interconnection layer 400 may be substantially the same as those described above with reference to FIGS. 2A to 2D.

Figure 3A:
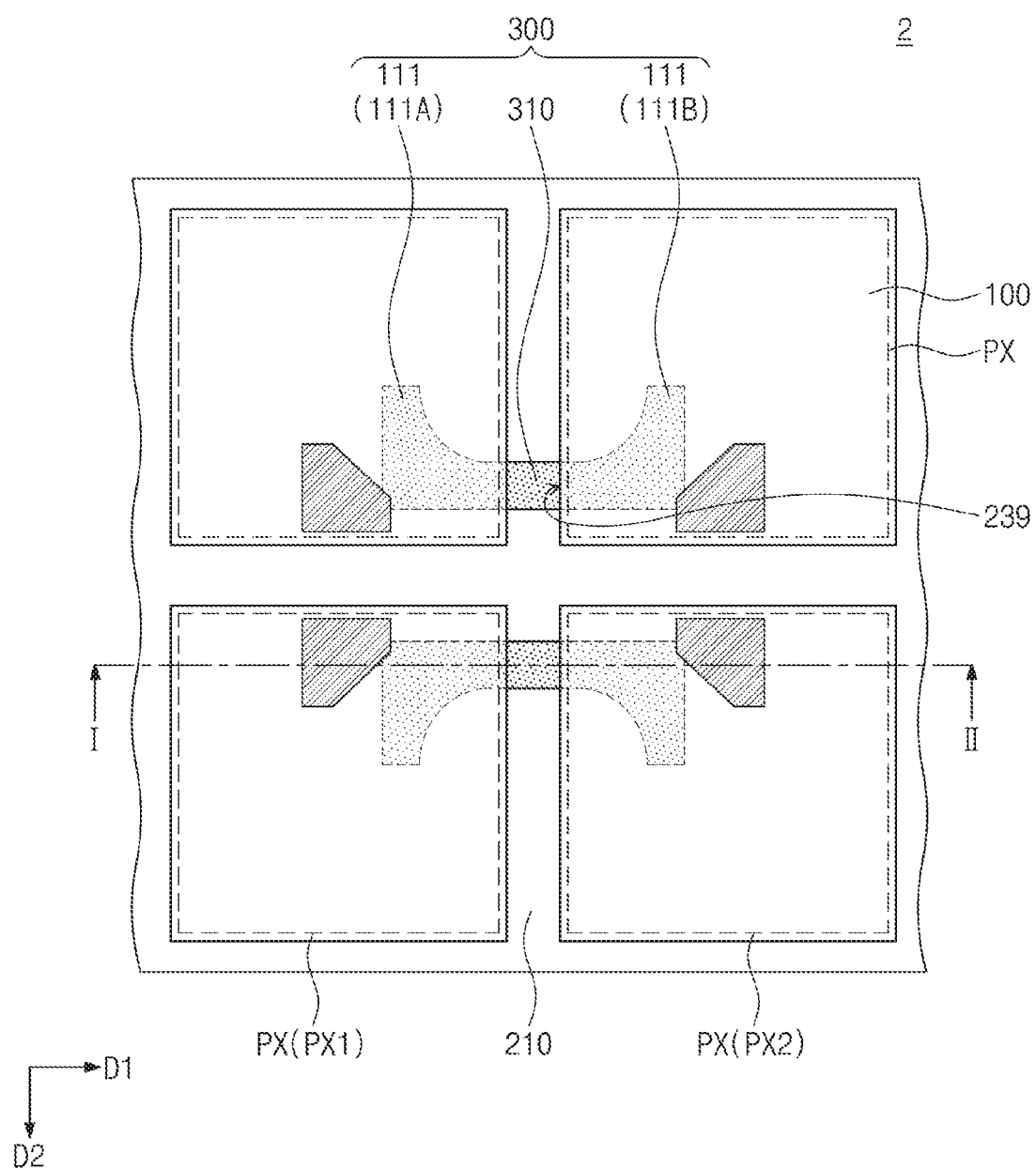
FIG. 3A illustrates a plan view showing an image sensor according to exemplary embodiments.
Figure 3B:
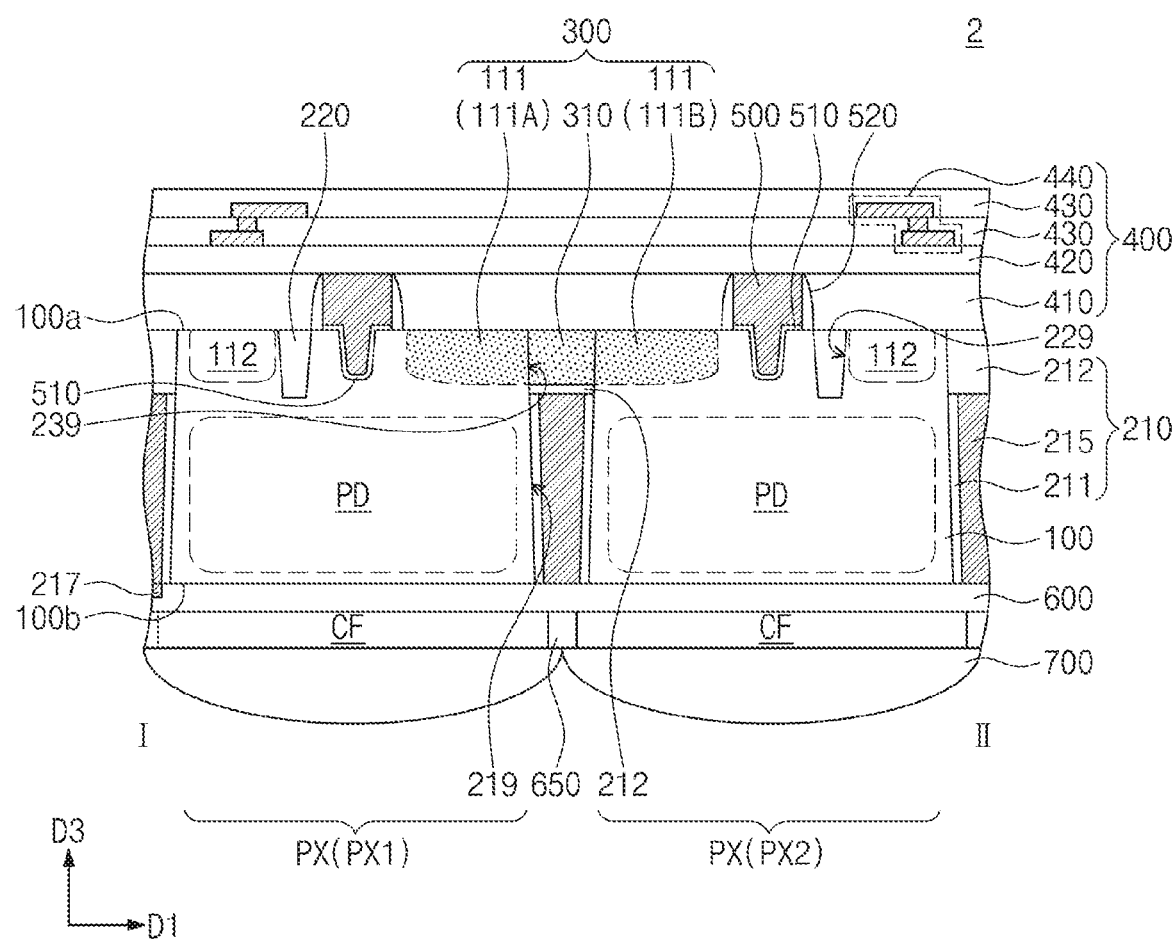
FIG. 3B illustrates a cross-sectional view taken along line I-II of FIG. 3A.

FIG. 3A illustrates a plan view showing an image sensor according to exemplary embodiments. FIG. 3B illustrates a cross-sectional view taken along line I-II of FIG. 3A. For convenience of explanation, a further description of elements and technical aspects previously described may be omitted below.

Referring to FIGS. 3A and 3B, an image sensor 2 may include the substrate 100, the isolation pattern 210, the device dielectric pattern 220, the conductive connection pattern 310, the gate pattern 500, and the interconnection layer 400. The substrate 100, the isolation pattern 210, the device dielectric pattern 220, the conductive connection pattern 310, the gate pattern 500, and the interconnection layer 400 may be substantially the same as those described above with reference to FIGS. 2A to 2D.

The impurity regions 111 may be disposed on corresponding pixel regions PX. In the substrate 100, the impurity region 111 may be adjacent to the first surface 100a of the substrate 100. The impurity regions 111 may be active regions. Each of the impurity regions 111 may include the floating diffusion region FD described above with reference to FIG. 1. The impurity regions 111 may include impurities whose conductive type is different from that of the substrate 100. The impurity regions 111 may include the second conductive type impurities (e.g., n-type impurities). The gate pattern 500 may serve as the transfer gate TG described above with reference to FIG. 1. However, the present inventive concept is not limited thereto.

The conductive connection pattern 310 may be interposed between and electrically connected to the first impurity region 111A and the second impurity region 111B. Dopants in the conductive connection pattern 310 may include the same element as that of impurities doped in the first impurity region 111A and that of impurities doped in the second impurity region 111B. The dopants of the conductive connection pattern 310 may have a second conductive type. The conductive connection pattern 310, the first impurity region 111A, and the second impurity region 111B may constitute the share structure 300.

In exemplary embodiments, the contact plug 450 described above with reference to FIGS. 2A to 2D is not disposed on the share structure 300. For example, in exemplary embodiments, no contact plug may be separately provided on the conductive connection pattern 310 and the impurity regions 111.

Figure 4A:
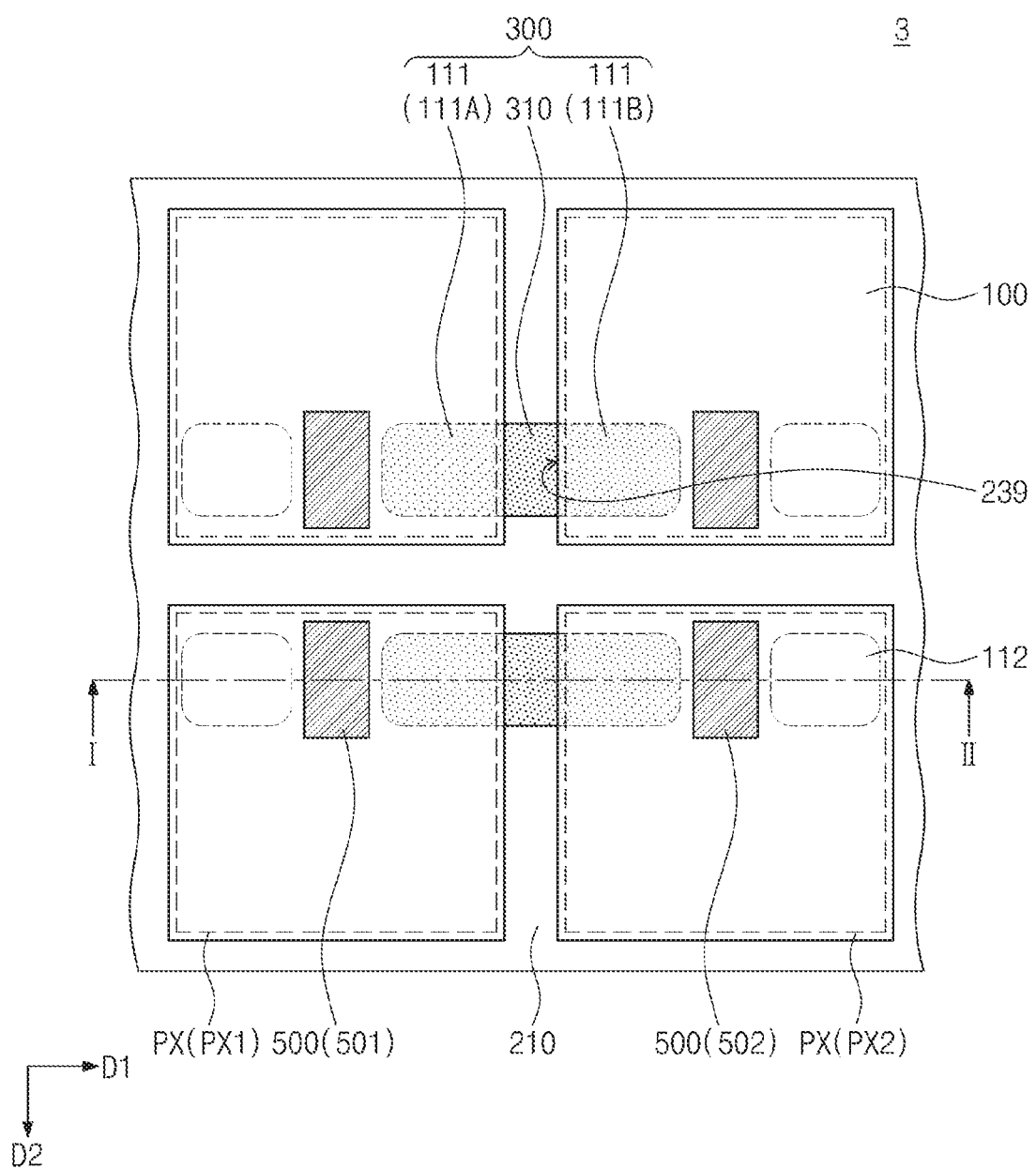
FIG. 4A illustrates a plan view showing an image sensor according to exemplary embodiments.
Figure 4B:
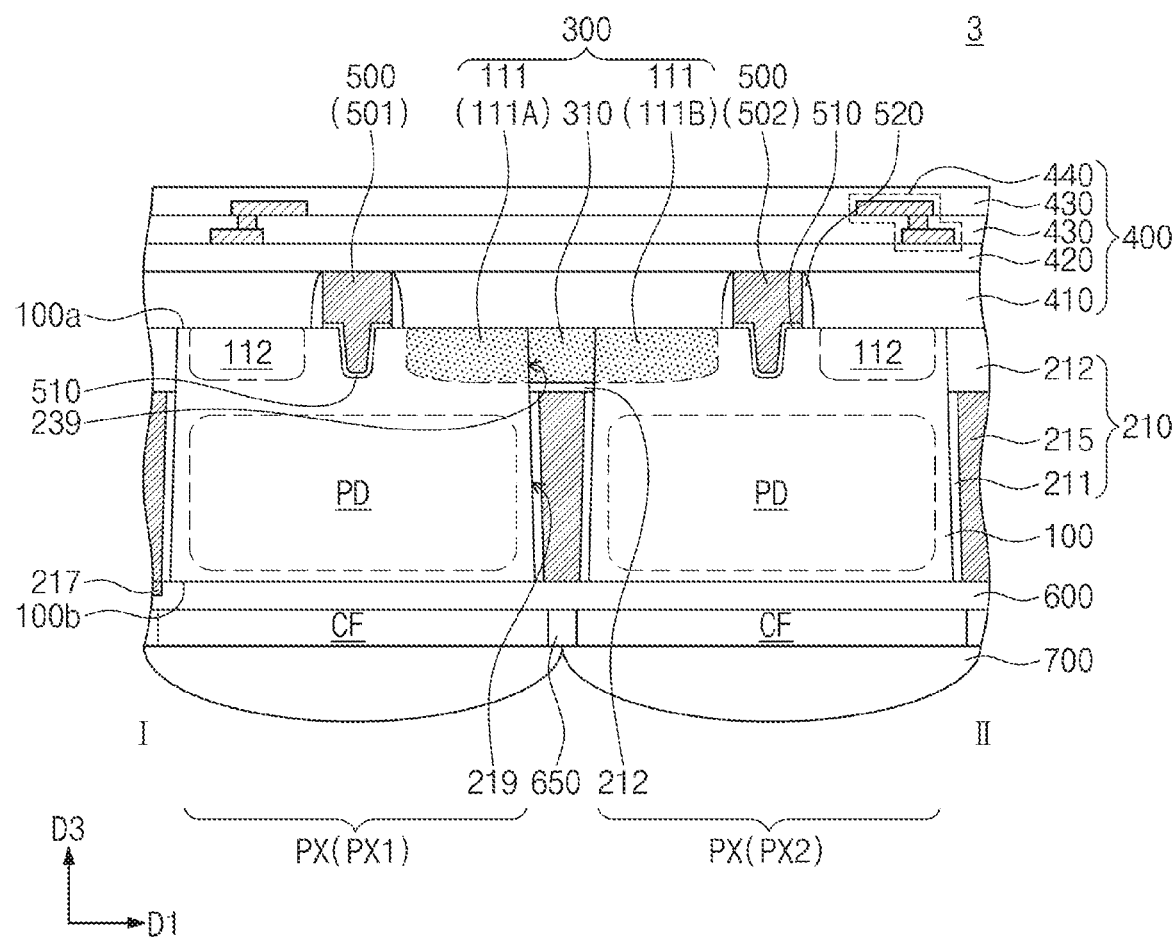
FIG. 4B illustrates a cross-sectional view taken along line I-II of FIG. 4A.

FIG. 4A illustrates a plan view showing an image sensor according to exemplary embodiments. FIG. 4B illustrates a cross-sectional view taken along line I-II of FIG. 4A. For convenience of explanation, a further description of elements and technical aspects previously described may be omitted below. The following description of FIGS. 4A and 4B also refers to FIG. 1.

Referring to FIGS. 4A and 4B, an image sensor 3 may include the substrate 100, the isolation pattern 210, the conductive connection pattern 310, the gate pattern 500, and the interconnection layer 400. The substrate 100, the isolation pattern 210, the conductive connection pattern 310, the gate pattern 500, and the interconnection layer 400 may be substantially the same as those described above. The image sensor 3 may further include the device dielectric pattern 220 described above with reference to FIGS. 2A to 2D. The first impurity region 111A, the second impurity region 111B, and the conductive connection pattern 310 may constitute the share structure 300.

The gate pattern 500 may include a first gate pattern 501 and a second gate pattern 502. The first gate pattern 501 may be disposed in the first pixel region PX1 of the substrate 100, and the second gate pattern 502 may be disposed in the second pixel region PX2 of the substrate 100. Each of the first and second gate patterns 501 and 502 may have substantially the same structure as that of the gate pattern 500 described above with reference to FIGS. 2A to 2D. The first gate pattern 501 may be a transistor gate whose function is different from that of the second gate pattern 502. For example, one of the first and second gate patterns 501 and 502 may be the source follower gate SG, and the other one of the first and second gate patterns 501 and 502 may be the selection gate AG. For convenience of explanation, the following description will explain an example in which the first gate pattern 501 is the source follower gate SG and the second gate pattern 502 is the selection gate AG. However, the present inventive concept is not limited thereto.

In the substrate 100, the first impurity region 111A and the second impurity region 111B may be adjacent to the first surface 100a of the substrate 100. The first impurity region 111A may be a source/drain region of a source follower transistor. The second impurity region 111B may be a source/drain region of a selection transistor. The first and second impurity regions 111A and 111B may include impurities whose conductive type is different from that of the substrate 100. The first and second impurity regions 111A and 111B may include the second conductive type impurities (e.g., n-type impurities).

The arrangement and electrical connection relations between the conductive connection pattern 310 and the impurity region 111 may be substantially the same as those described above with reference to FIGS. 2A to 2D. In a plan view, the conductive connection pattern 310 may be disposed between the first gate pattern 501 and the second gate pattern 502. In a plan view, the first impurity region 111A may be disposed between the conductive connection pattern 310 and the first gate pattern 501, and the second impurity region 111B may be disposed between the conductive connection pattern 310 and the second gate pattern 502. The conductive connection pattern 310 may be in physical contact with and electrically connected to the first impurity region 111A and the second impurity region 111B. In contrast, the conductive connection pattern 310 may electrically connect the source/drain region of the source follower transistor to the source/drain region of the selection transistor. For example, the drain region of the source follower transistor may be electrically connected through the conductive connection pattern to the source region of the selection transistor. Dopants of the conductive connection pattern 310 may be the same element of impurities doped in the first and second impurity regions 111A and 111B.

Because the share structure 300 is provided, the image sensor 3 may have simplified components and may decrease in size. For example, in exemplary embodiments, the first pixel region PX1 does not include the source region of the selection transistor, and the second pixel region PX2 does not include the drain region of the source follower transistor. According to exemplary embodiments, it may be possible to more freely design components of the image sensor 3. The components may include, for example, the impurity regions 111, the doping regions 112, the isolation pattern 210, the device dielectric pattern 220, the gate pattern 500, and the interconnection layer 400.

In exemplary embodiments, the contact plug 450 described above with reference to FIGS. 2A to 2D is not disposed on the share structure 300. For example, in exemplary embodiments, no contact plug may be separately provided on the first impurity region 111A, the second impurity region 111B, and the conductive connection pattern 310.

Figure 5A:
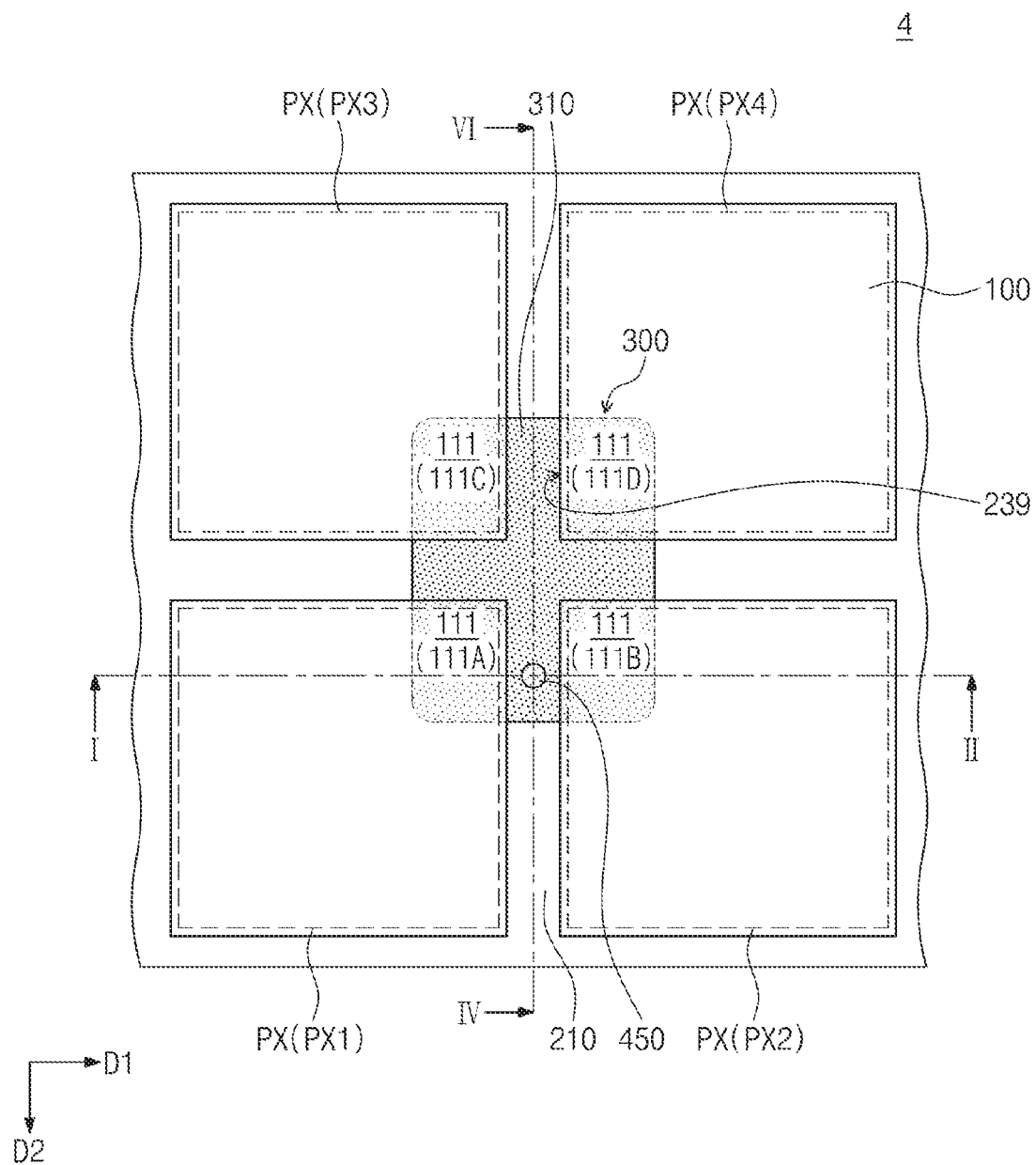
FIG. 5A illustrates a plan view showing an image sensor according to exemplary embodiments.
Figure 5B:
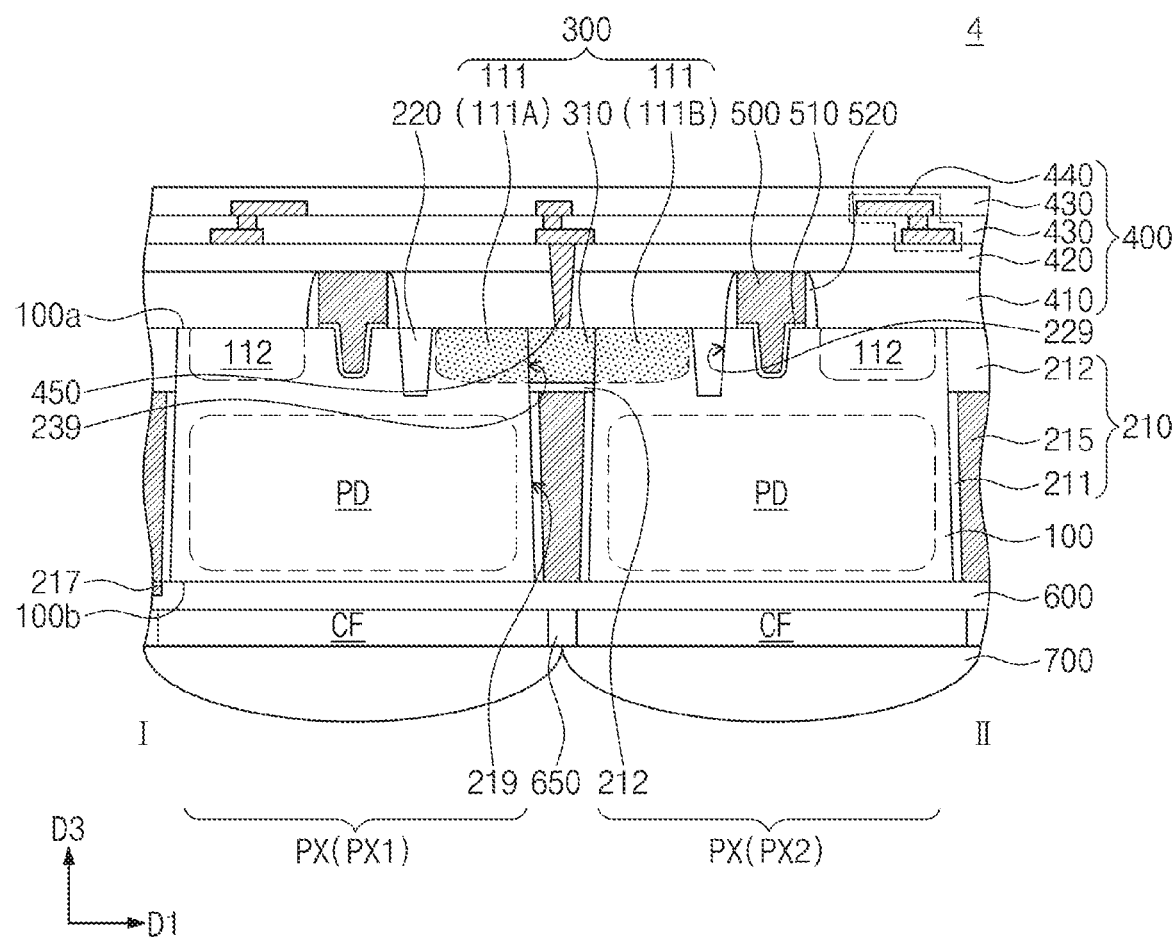
FIG. 5B illustrates a cross-sectional view taken along line I-II of FIG. 5A.
Figure 5C:
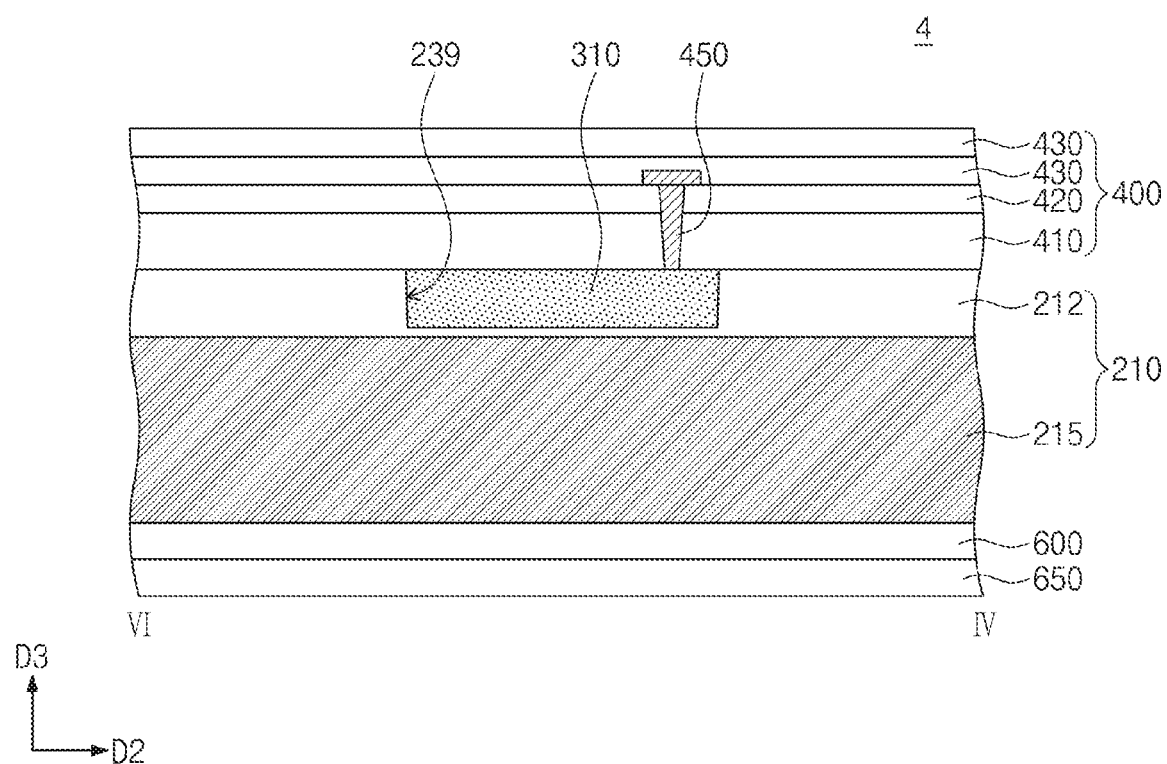
FIG. 5C illustrates a cross-sectional view taken along line VI-IV of FIG. 5A.

FIG. 5A illustrates a plan view showing an image sensor according to exemplary embodiments. FIG. 5B illustrates a cross-sectional view taken along line I-II of FIG. 5A. FIG. 5C illustrates a cross-sectional view taken along line VI-IV of FIG. 5A. For convenience of explanation, a further description of elements and technical aspects previously described may be omitted below.

Referring to FIGS. 5A to 5C, an image sensor 4 may include the substrate 100, the isolation pattern 210, the device dielectric pattern 220, the conductive connection pattern 310, the gate pattern 500, and the interconnection layer 400. The substrate 100, the isolation pattern 210, the gate pattern 500, and the interconnection layer 400 may be substantially the same as those described above.

The pixel regions PX may include a first pixel region PX1, a second pixel region PX2, a third pixel region PX3, and a fourth pixel region PX4. The first pixel region PX1 may be adjacent to the second pixel region PX2 in the first direction D1. The third pixel region PX3 may be adjacent to the first pixel region PX1 in the second direction D2. The third pixel region PX3 and the first pixel region PX1 may be spaced apart from each other in the second direction D2 or in a direction opposite to the second direction D2. The third pixel region PX3 may be adjacent to the fourth pixel region PX4 in the first direction D1. The fourth pixel region PX4 and the third pixel region PX3 may be spaced apart from each other in the first direction D1 or in a direction opposite to the first direction D1. The fourth pixel region PX4 may be adjacent to the second pixel region PX2 in the second direction D2.

The impurity regions 111 may include a first impurity region 111A, a second impurity region 111B, a third impurity region 111C, and a fourth impurity region 111D. The first impurity region 111A, the second impurity region 111B, the third impurity region 111C, and the fourth impurity region 111D may be respectively provided in the first pixel region PX1, the second pixel region PX2, the third pixel region PX3, and the fourth pixel region PX4. The first impurity region 111A may be disposed symmetrically to each of the second impurity region 111B and the third impurity region 111C. The second impurity region 111B may be disposed symmetrically to the fourth impurity region 111D. The third impurity region 111C may be disposed symmetrically to the fourth impurity region 111D.

The impurity regions 111 of the first, second, third, and fourth pixel regions PX1, PX2, PX3, and PX4 may be ground regions described above with reference to FIGS. 2A to 2D. The impurity regions 111 may include the second conductive type impurities (e.g., p-type dopants).

The conductive connection pattern 310 may be in physical contact with and electrically connected to the impurity regions 111 of the first, second, third, and fourth pixel regions PX1, PX2, PX3, and PX4. Dopants of the conductive connection pattern 310 may be the same element as that of dopants included in the first, second, third, and fourth pixel regions PX1, PX2, PX3, and PX4.

The share structure 300 may be constituted by the conductive connection pattern 310 and the impurity regions 111 of the first, second, third, and fourth pixel regions PX1, PX2, PX3, and PX4. A single contact plug 450 may be disposed on and coupled to the conductive connection pattern 310. In exemplary embodiments, differently from that shown, the contact plug 450 may be disposed on one of the first, second, third, and fourth impurity regions 111A, 111B, 111C, and 111D. The first, second, third, and fourth impurity regions 111A, 111B, 111C, and 111D may be supplied through the single contact plug 450 with the second voltage.

Figure 6A:
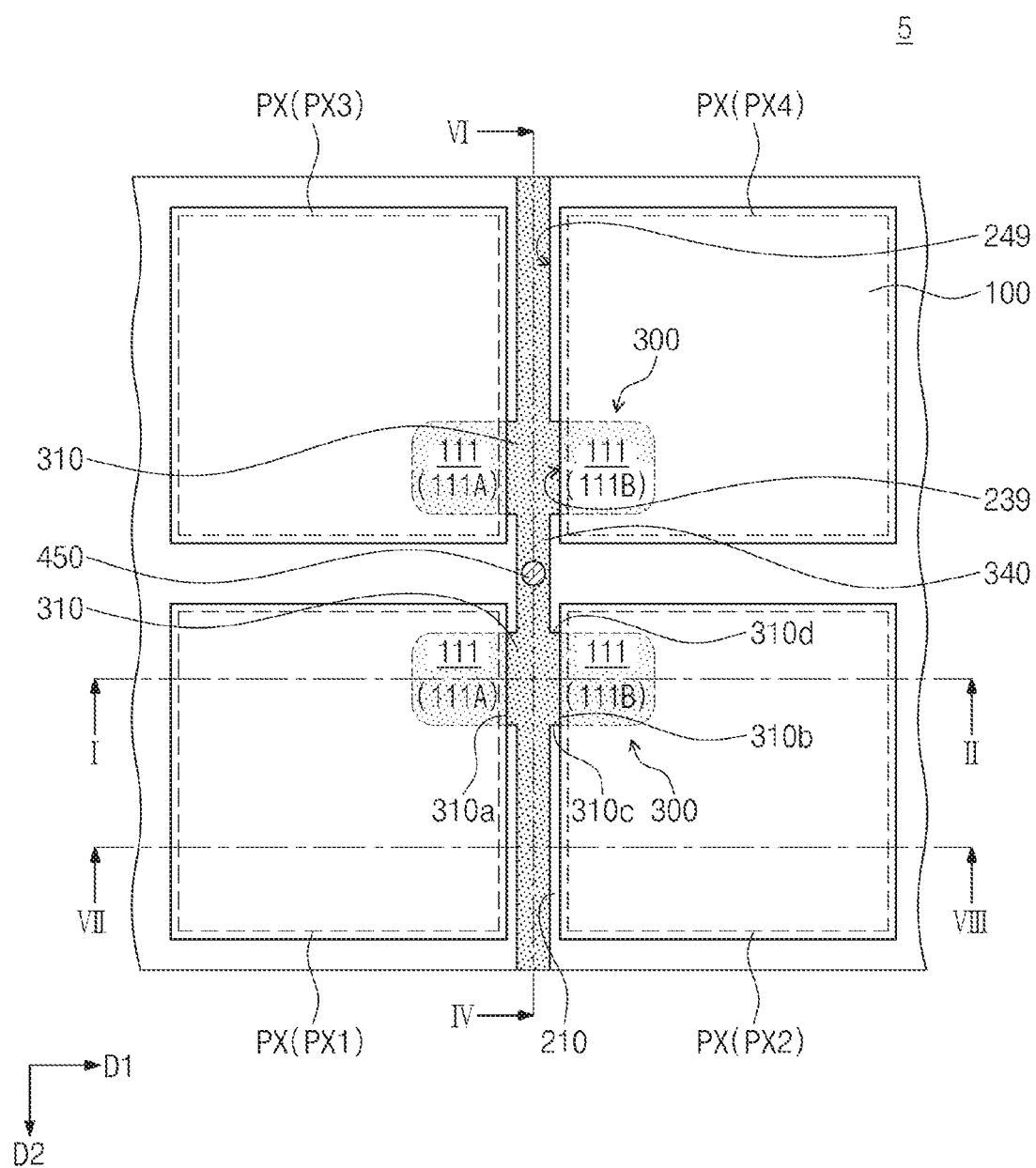
FIG. 6A illustrates a plan view showing an image sensor according to exemplary embodiments.
Figure 6B:
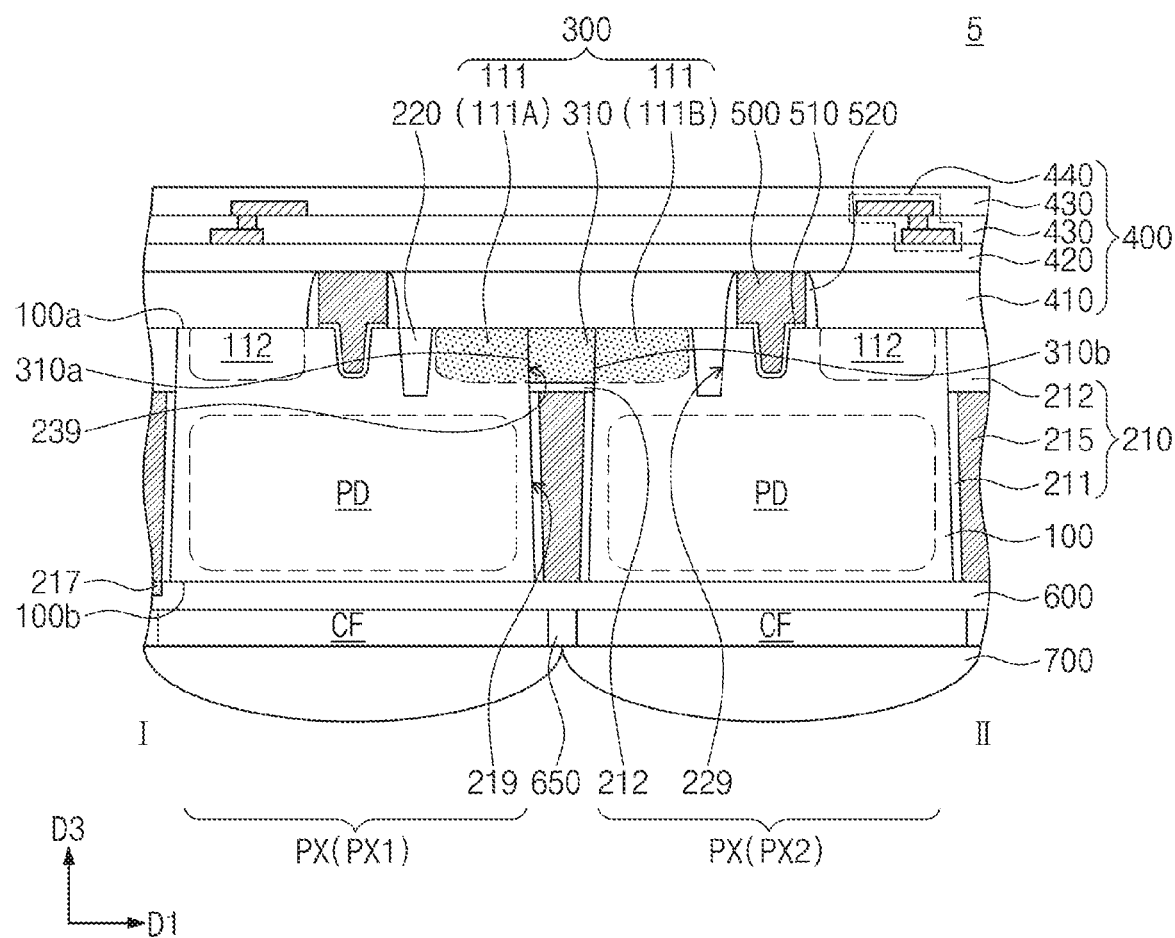
FIG. 6B illustrates a cross-sectional view taken along line I-II of FIG. 6A.
Figure 6C:
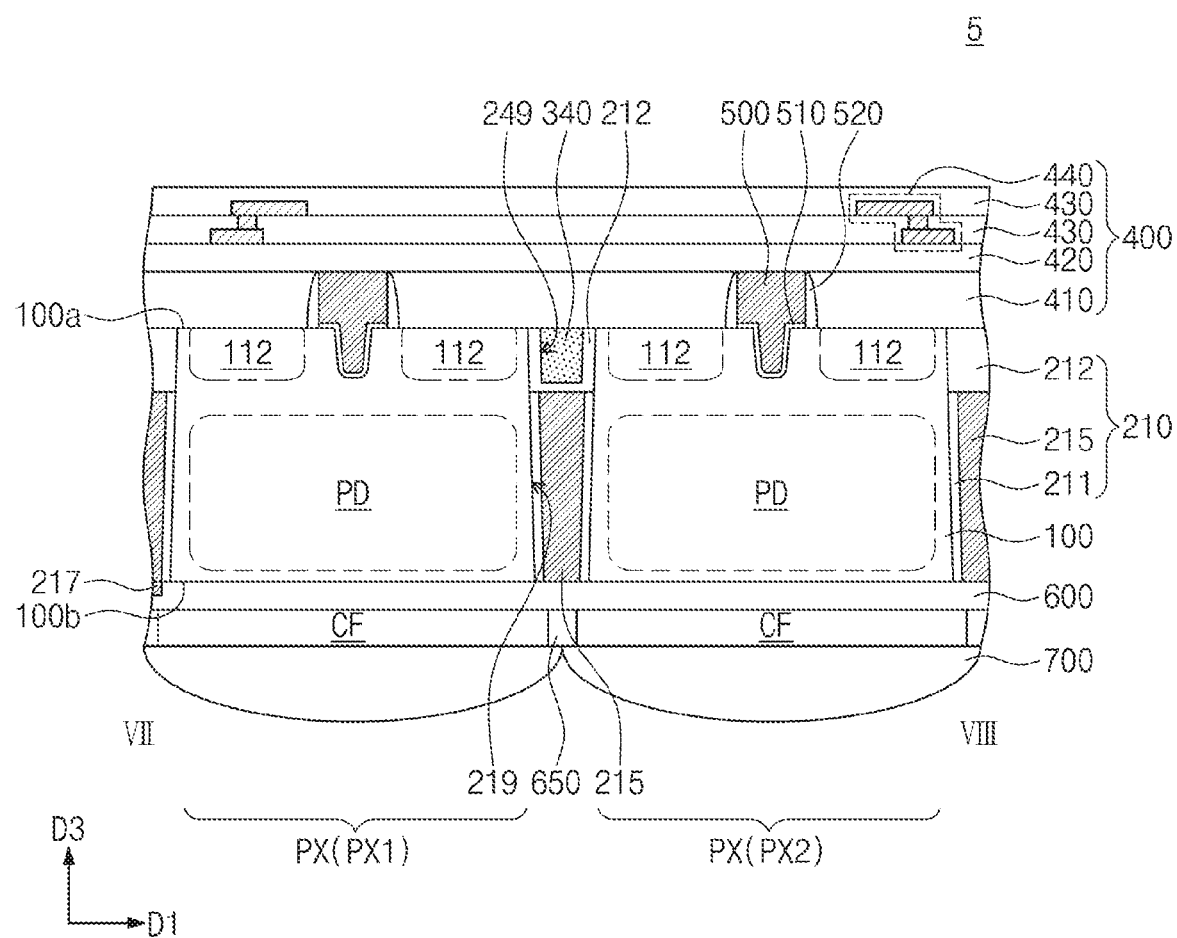
FIG. 6C illustrates a cross-sectional view taken along line VII-VIII of FIG. 6A.
Figure 6D:
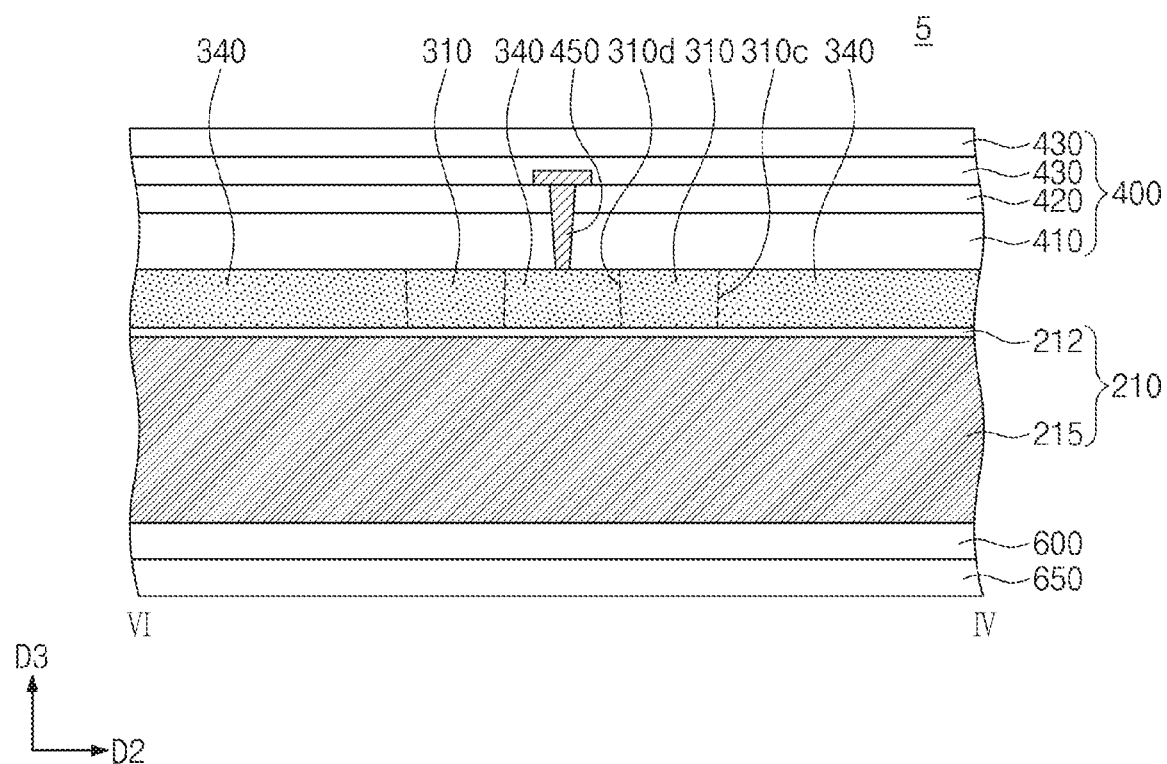
FIG. 6D illustrates a cross-sectional view taken along line VI-IV of FIG. 6A.

FIG. 6A illustrates a plan view showing an image sensor according to exemplary embodiments. FIG. 6B illustrates a cross-sectional view taken along line I-II of FIG. 6A. FIG. 6C illustrates a cross-sectional view taken along line VII-VIII of FIG. 6A. FIG. 6D illustrates a cross-sectional view taken along line VI-Iv of FIG. 6A. For convenience of explanation, a further description of elements and technical aspects previously described may be omitted below.

Referring to FIGS. 6A to 6D, an image sensor 5 may include the substrate 100, the isolation pattern 210, the device dielectric pattern 220, the conductive connection pattern 310, the gate pattern 500, and the interconnection layer 400, and may further include a wiring pattern 340. The wiring pattern 340 may be disposed on the isolation pattern 210. The substrate 100, the isolation pattern 210, the device dielectric pattern 220, the conductive connection pattern 310, the gate pattern 500, and the interconnection layer 400 may be substantially the same as those described above. The share structure 300 may be provided in plural, and the plurality of share structures 300 may include corresponding conductive connection patterns 310. The conductive connection patterns 310 may be electrically connected to corresponding impurity regions 111. Each of the conductive connection patterns 310 may include a first sidewall 310a, a second sidewall 310b, a third sidewall 310c, and a fourth sidewall 310d. The third sidewall 310c of each of the conductive connection patterns 310 may neighbor the first sidewall 310a and the second sidewall 310b. The fourth sidewall 310d of each of the conductive connection patterns 310 may face the third sidewall 310c. The wiring pattern 340 may be connected to the third sidewall 310c.

As shown in FIG. 6C, the wiring pattern 340 may be provided in a fourth trench 249, and the fourth trench 249 may be recessed from the first surface 100a of the substrate 100. In a plan view, as shown in FIG. 6A, the wiring pattern 340 may have a major axis substantially parallel to the second direction D2. For example, a lengthwise direction of the wiring pattern 240 may extend substantially parallel to the second direction D2. The wiring pattern 340 may be connected to at least two share structures 300. The wiring pattern 340 may be connected to the conductive connection patterns 310. For example, as shown in FIG. 6D, the wiring pattern 340 may be connected to the third and fourth sidewalls 310c and 310d of each of the conductive connection patterns 310. For convenience of description, FIG. 6D shows a dotted line that differentiates the wiring pattern 340 from the conductive connection patterns 310. The wiring pattern 340 may include the same material as that of the conductive connection patterns 310, and the wiring pattern 340 and the conductive connection patterns 310 may be connected to each other without boundaries therebetween. For example, the wiring pattern 340 and the conductive connection patterns 310 may be directly connected to each other. The wiring pattern 340 may include a crystalline semiconductor material and dopants. For example, the wiring pattern 340 may include doped polysilicon. The dopants included in the wiring pattern 340 may have the same conductive type of dopants of the conductive connection pattern 310. The dopants included in the wiring pattern 340 may be the same element as that of dopants included in the conductive connection pattern 310. However, the present inventive concept is not limited thereto. For example, in exemplary embodiments, the wiring pattern 340 may include various materials. For example, the wiring pattern 340 may include metal, such as copper, aluminum, titanium, and/or tungsten.

In a plan view, the wiring pattern 340 may overlap the isolation pattern 210. The wiring pattern 340 and the conductive isolation pattern 215 may vertically overlap each other, as shown in FIG. 6C. The wiring pattern 340 may be provided in the second dielectric isolation pattern 212. The second dielectric isolation pattern 212 may be interposed between the wiring pattern 340 and the conductive isolation pattern 215 and between the wiring pattern 340 and the substrate 100. The second dielectric isolation pattern 212 may electrically separate the wiring pattern 340 from the conductive isolation pattern 215 and the substrate 100.

As shown in FIG. 6D, on the wiring pattern 340, the contact plug 450 may penetrate the first dielectric layer 410. The contact plug 450 may be in direct contact with the wiring pattern 340. In exemplary embodiments, differently from that shown, the contact plug 450 may be directly coupled not to the wiring pattern 340, but to one of the share structures 300. For example, the contact plug 450 may be coupled to the conductive connection patterns 310 or the impurity regions 111. According to exemplary embodiments, the wiring pattern 340 may allow a single contact plug 450 to have electrical connection with the impurity regions 111 of a plurality of share structures 300. The impurity regions 111 of the first, second, third, and fourth pixel regions PX1, PX2, PX3, and PX4 may be supplied through the single contact plug 450 with the second voltage.

Figure 7A:
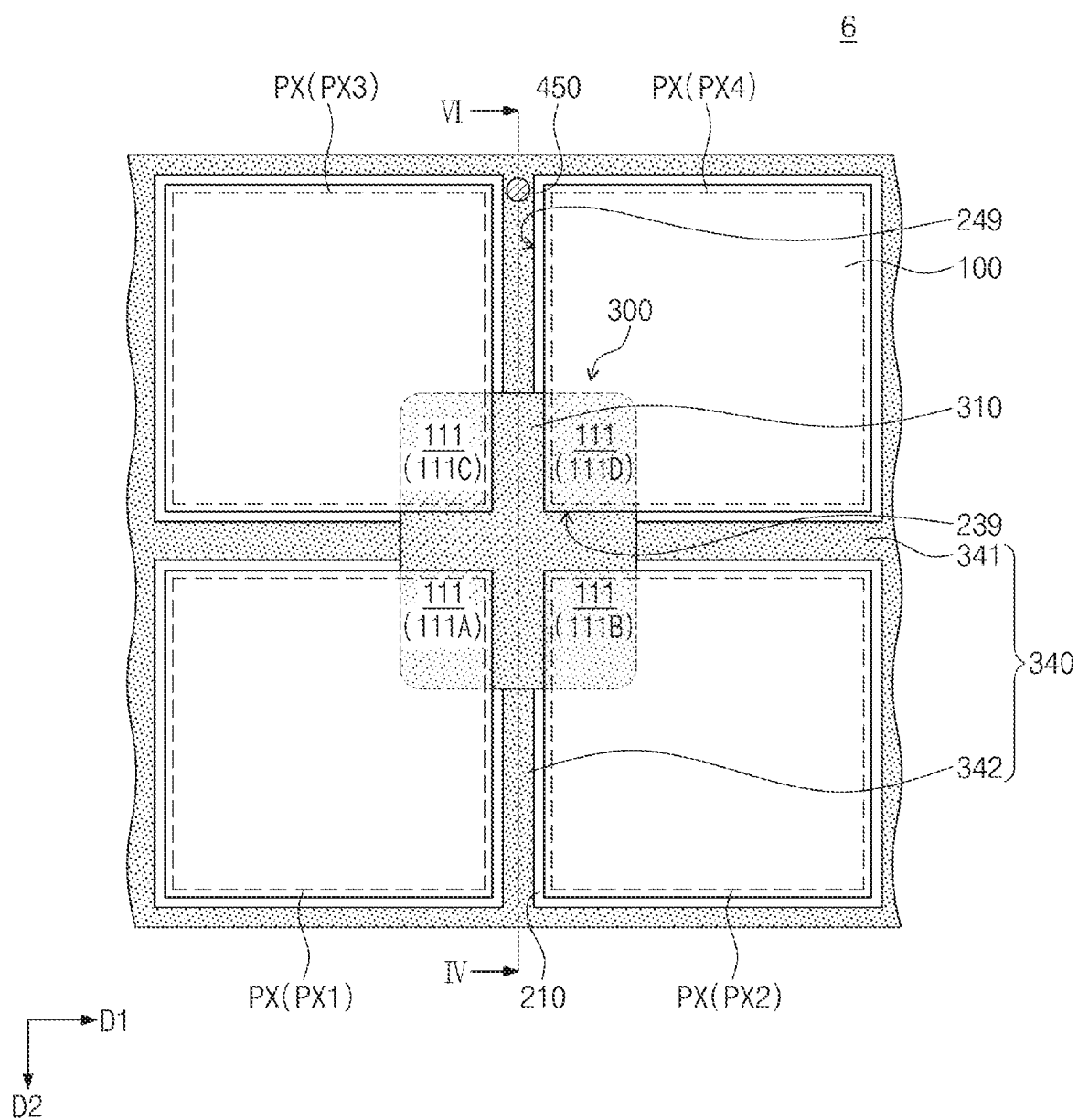
FIG. 7A illustrates a plan view showing an image sensor according to exemplary embodiments.
Figure 7B:
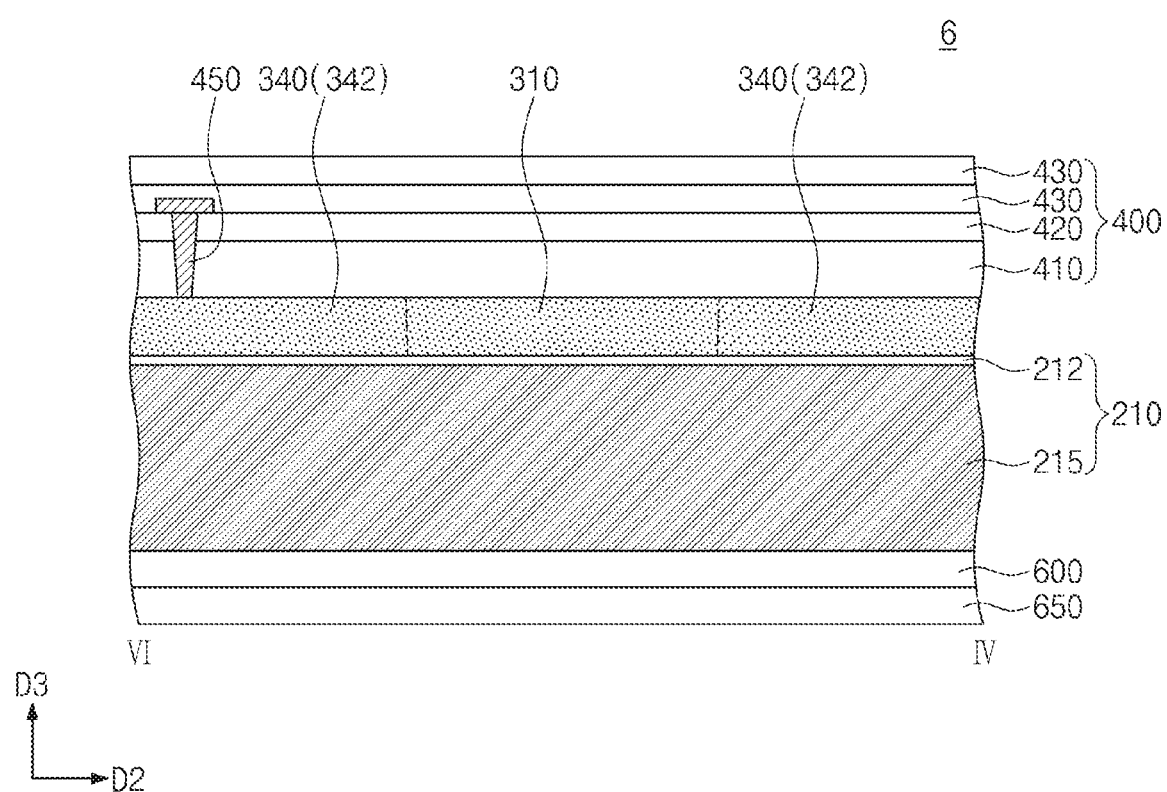
FIG. 7B illustrates a cross-sectional view taken along line VI-IV of FIG. 7A.

FIG. 7A illustrates a plan view showing an image sensor according to exemplary embodiments. FIG. 7B illustrates a cross-sectional view taken along line VI-IV of FIG. 7A. The following description of FIGS. 7A and 7B also refers to FIGS. 6B and 6C.

Referring to FIGS. 7A and 7B, an image sensor 6 may include the substrate 100, the isolation pattern 210, the device dielectric pattern 220, the conductive connection pattern 310, the gate pattern 500, and the wiring pattern 340, and may further include a wiring pattern 340. The conductive connection pattern 310 and the impurity region 111 may be substantially the same as those described above with reference to FIGS. 5A to 5C. For example, the conductive connection pattern 310 may be in physical contact with and electrically connected to the impurity regions 111 of the first, second, third, and fourth pixel regions PX1, PX2, PX3, and PX4.

The wiring pattern 340 may be the same as or similar to that described above with reference to FIGS. 6A to 6D. In contrast, in exemplary embodiments, the wiring pattern 340 may include a first wiring pattern 341 that extends along the first direction D1 and a second wiring pattern 342 that extends along the second direction D2. The second wiring pattern 342 may be connected to the first wiring pattern 341. In exemplary embodiments, differently from that shown, one of the first and second wiring patterns 341 and 342 may be omitted.

In exemplary embodiments, the wiring pattern 340 included in the image sensor 5 of FIGS. 6A to 6D may include the first wiring pattern 341 and the second wiring pattern 342 the same as those shown in FIGS. 7A and 7B. It is to be understood that a planar shape of the wiring pattern 340 is not limited to that shown in FIG. 6A or 7A, but rather, may be variously changed according to exemplary embodiments.

For the image sensor 4 of FIGS. 5A to 5C, the image sensor 5 of FIGS. 6A to 6D, and the image sensor 6 of FIGS. 7A and 7B, the impurity regions 111 are not limited to their functions as ground regions, but rather, may be variously changed in their function. For example, each of the impurity regions 111 of the first, second, third, and fourth pixel regions PX1, PX2, PX3, and PX4 may serve as a floating diffusion region described above with reference to FIGS. 3A and 3B. In this case, the impurity regions 111 of the pixel regions PX may include the second conductive type impurities (e.g., n-type impurities).

In another example, each of the impurity regions 111 may serve as a source/drain region described with reference to FIGS. 4A and 4B. In this case, the impurity regions 111 of the pixel regions PX may include the second conductive type impurities (e.g., n-type impurities).

The following will describe a method of fabricating an image sensor according to exemplary embodiments. In the following description, a pixel region may be interpreted to include a region where pixels described with reference to FIG. 1 are and will be formed.

FIGS. 8A to 8H illustrate cross-sectional views taken along lines I-II and III-IV of FIG. 2A, showing a method of fabricating an image sensor according to exemplary embodiments. Thus, the description of FIGS. 8A to 8H also refers to FIG. 2A, and For convenience of explanation, a further description of elements and technical aspects previously described may be omitted below.

Figure 8A:
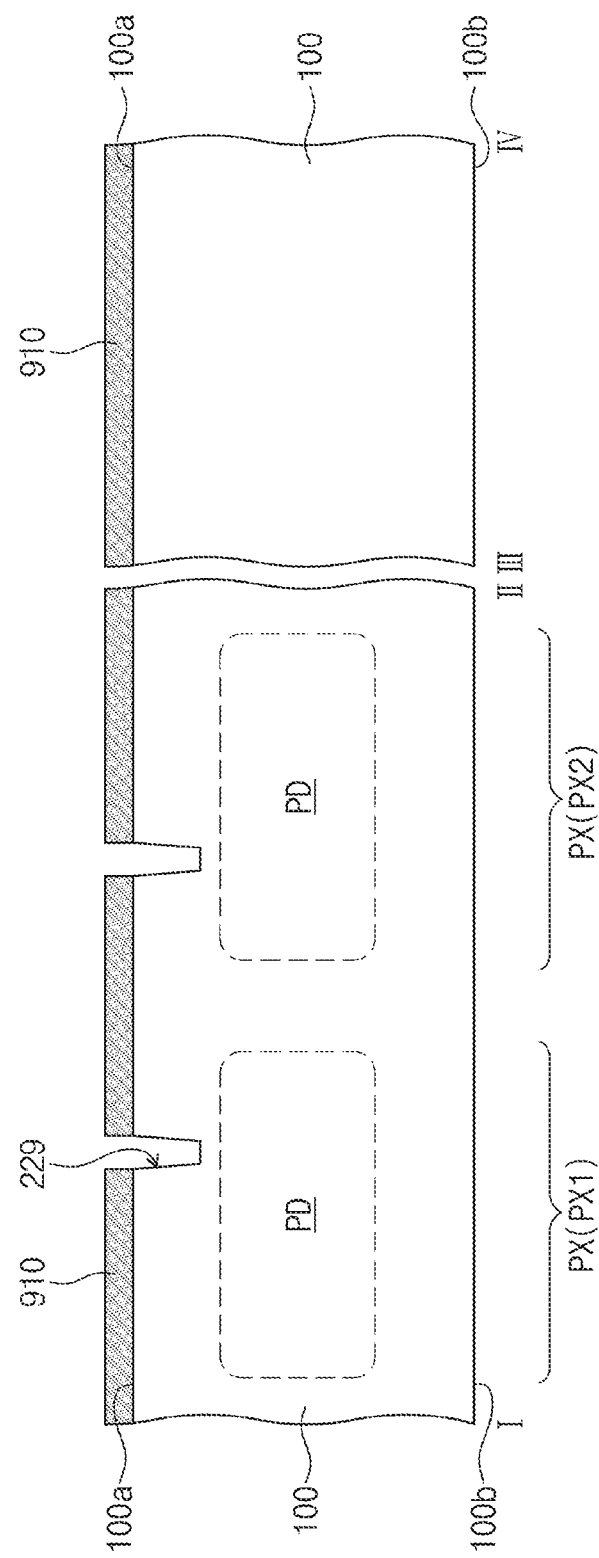
FIGS. 8A to 8H illustrate cross-sectional views showing a method of fabricating an image sensor according to exemplary embodiments.

Referring to FIG. 8A, a photoelectric conversion region PD may be formed in a substrate 100. A first mask pattern 910 may be formed on a first surface 100a of the substrate 100. The first mask pattern 910 may include a photoresist material. The formation of the first mask pattern 910 may include coating a preliminary mask pattern on the substrate 100, and using a photomask to perform exposure and development processes on the preliminary mask pattern. An etching process may be performed in which the first mask pattern 910 is used to form a first trench 229 in the substrate 100. The first trench 229 may be a shallow trench. After the formation of the first trench 229, the first mask pattern 910 may be removed.

Figure 8B:
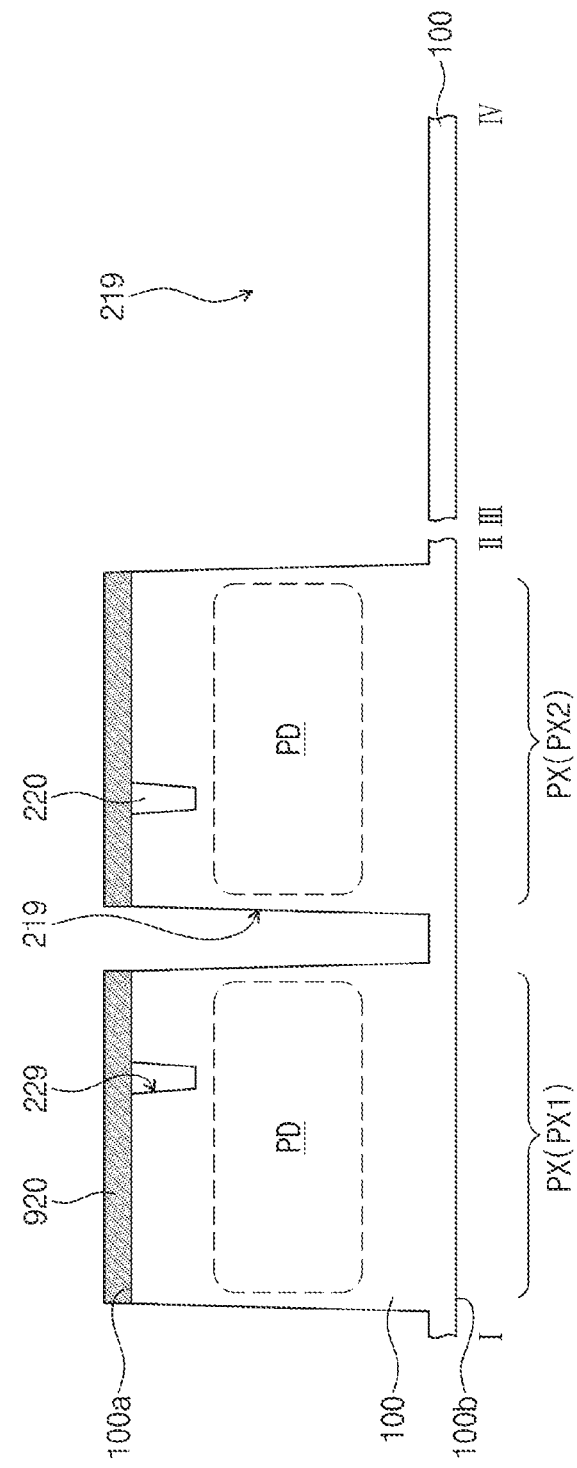

Referring to FIG. 8B, the first trench 229 may be filled with a dielectric material to form a device dielectric pattern 220. The device dielectric pattern 220 may be localized in the first trench 229.

A second mask pattern 920 may be formed on the first surface 100a of the substrate 100, thereby covering the device dielectric pattern 220 and the first surface 100a of the substrate 100. The second mask pattern 920 may include a photoresist material. An etching process may be performed in which the second mask pattern 920 is used to form a second trench 219 in the substrate 100 between pixel regions PX. The second trench 219 may penetrate a portion of the substrate 100. The second trench 219 may have a bottom surface provided in the substrate 100. The second trench 219 may be a deep trench. The second trench 219 may have a depth greater than that of the first trench 229. Subsequently, the second mask pattern 920 may be removed.

Figure 8C:
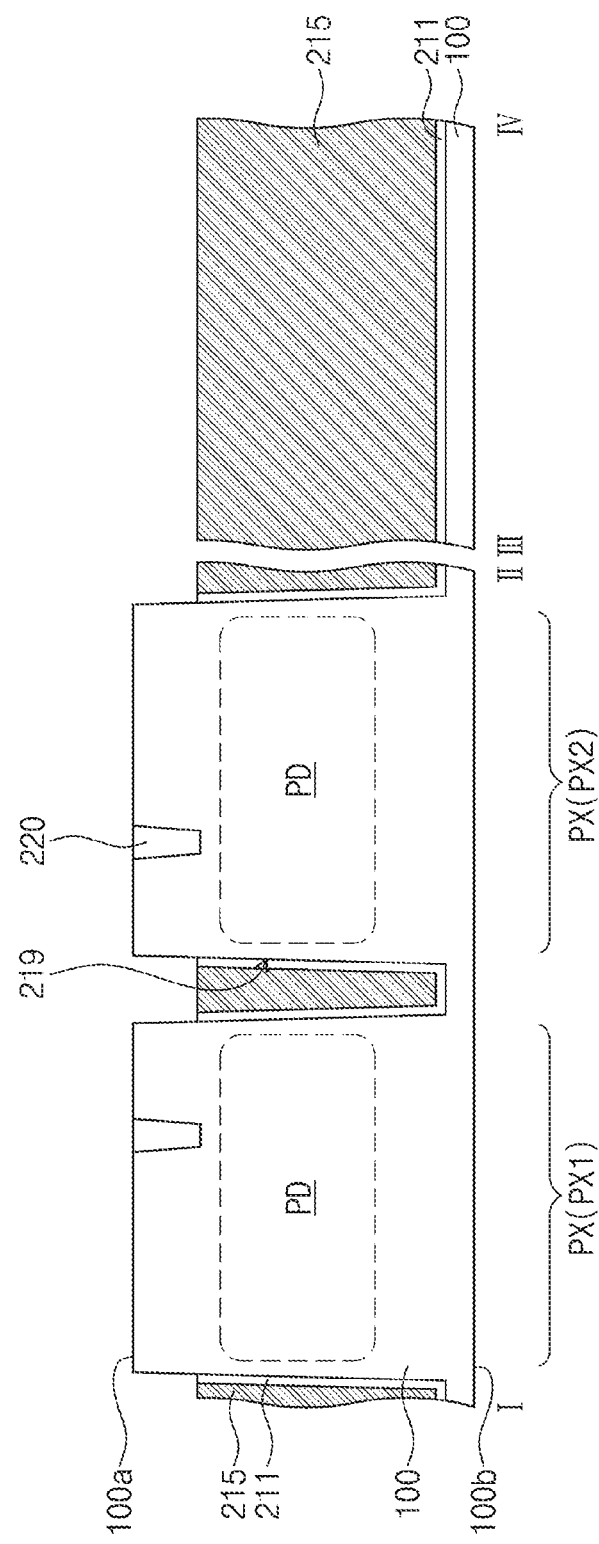

Referring to FIG. 8C, a first dielectric isolation pattern 211 and a conductive isolation pattern 215 may be formed in the second trench 219. The formation of the first dielectric isolation pattern 211 and the conductive isolation pattern 215 may include forming a preliminary dielectric isolation pattern that conformally covers inner walls of the second trench 219, forming on the preliminary dielectric pattern a preliminary conductive isolation pattern that partially fills the second trench 219, and performing a recess process on the preliminary conductive isolation pattern and the preliminary dielectric isolation pattern. The recess process may include an etch-back process or a planarization process. The recess process may remove the preliminary dielectric isolation pattern and the preliminary conductive isolation pattern from an upper portion of the second trench 219. The preliminary dielectric isolation pattern may be recessed to form the first dielectric isolation pattern 211. The preliminary conductive isolation pattern may be recessed to form the conductive isolation pattern 215. The recess process may continue until an upper sidewall of the second trench 219 is exposed.

Figure 8D:
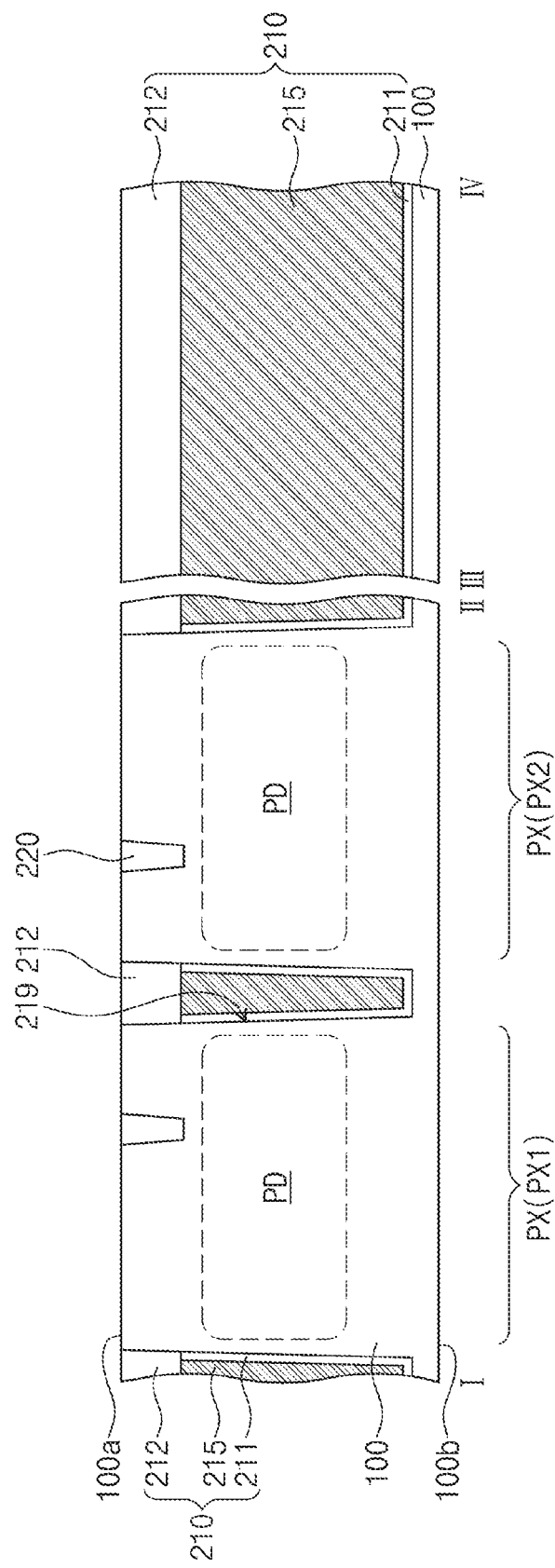

Referring to FIG. 8D, a second dielectric isolation pattern 212 may be formed on the first dielectric isolation pattern 211 and the conductive isolation pattern 215, thereby filling the second trench 219. The second dielectric isolation pattern 212 may have a top surface at substantially the same level as that of the first surface 100a of the substrate 100. For example, a top surface of the second dielectric isolation pattern 212 and the first surface 100a of the substrate 100 may be substantially coplanar. Therefore, an isolation pattern 210 may be fabricated. The isolation pattern 210 may include the first dielectric isolation pattern 211, the second dielectric isolation pattern 212, and the conductive isolation pattern 215.

Figure 8E:
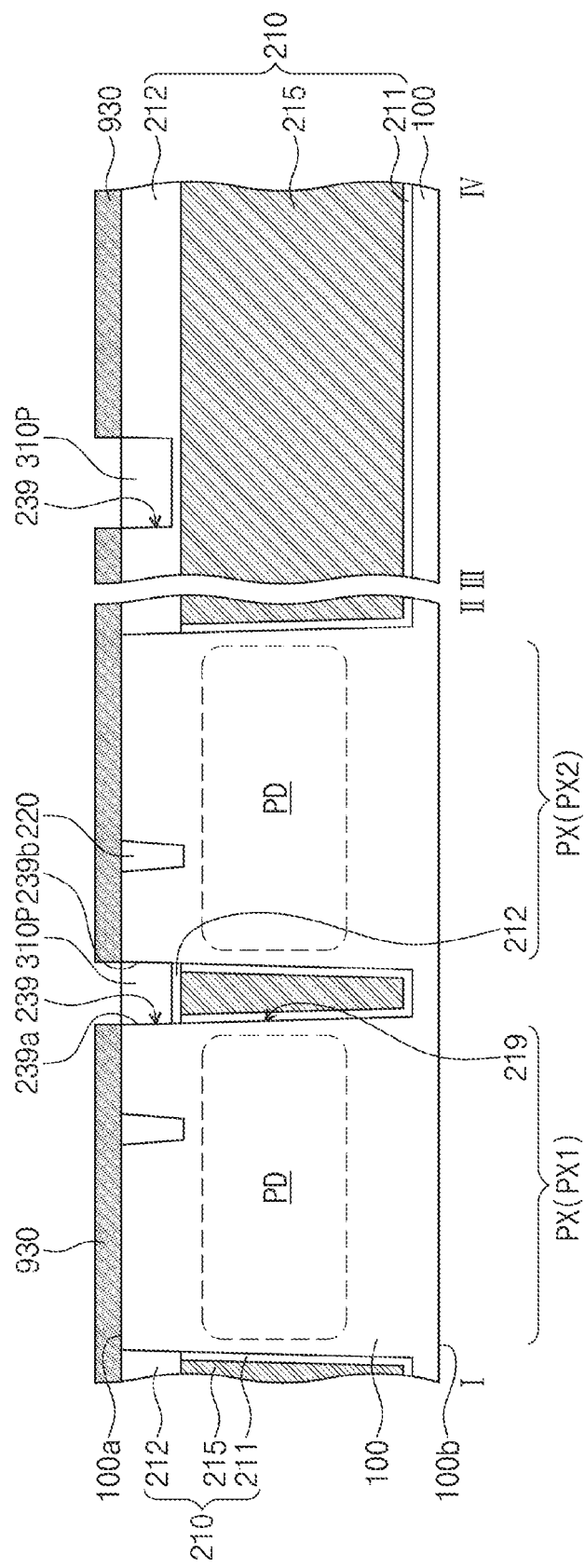

Referring to FIG. 8E, a third mask pattern 930 may be formed on the second dielectric isolation pattern 212 and the first surface 100a of the substrate 100. The third mask pattern 930 may expose a portion of the second dielectric isolation pattern 212. The second dielectric isolation pattern 212 may be removed at its portion exposed by the third mask pattern 930, and thus, a third trench 239 may be formed. For example, the third trench 239 may have a bottom surface provided in the second dielectric isolation pattern 212. The third trench 239 may have a first sidewall 239a and a second sidewall 239b facing each other. The substrate 100 may be exposed by the first and second sidewalls 239a and 239b of the third trench 239.

A preliminary conductive connection pattern 310P may be formed in the third trench 239. The formation of the preliminary conductive connection pattern 310P may include forming a semiconductor layer that fills the third trench 239. The semiconductor layer may undergo a recess process to expose the first surface 100a of the substrate 100. The preliminary conductive connection pattern 310P may have a top surface at substantially the same level as that of the first surface 100a of the substrate 100 and that of the top surface of the second dielectric isolation pattern 212. For example, the top surface of the preliminary conductive connection pattern 310P, the first surface 100a of the substrate 100, and the top surface of the second dielectric isolation pattern 212 may be substantially coplanar. Subsequently, the third mask pattern 930 may be removed.

Figure 8F:
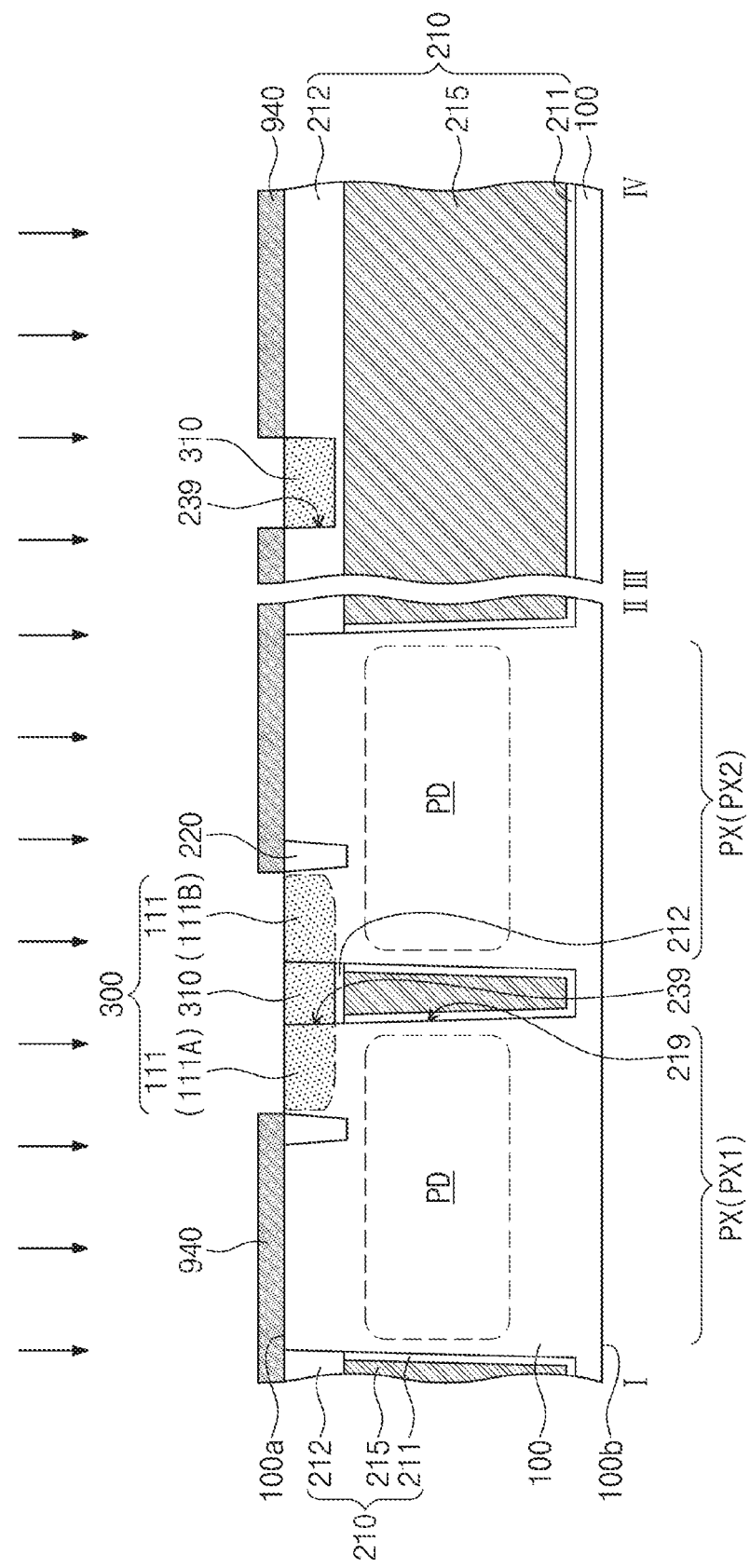

Referring to FIG. 8F, a fourth mask pattern 940 may be formed on the first surface 100a of the substrate 100. The fourth mask pattern 940 may include a photoresist material. The fourth mask pattern 940 may expose the top surface of the preliminary conductive connection pattern 310P and a portion of the first surface 100a of the substrate 100.

The preliminary conductive connection pattern 310P and the portion of the first surface 100a of the substrate 100 may be implanted with impurities to form a conductive connection pattern 310 and impurity regions 111. The impurity regions 111 may include a first impurity region 111A and a second impurity region 111B. The fourth mask pattern 940 may be used to implant the impurities. The impurities may serve as dopants in the conductive connection pattern 310 and the impurity regions 111. The formation of the impurity regions 111 and the conductive connection pattern 310 may fabricate a share structure 300. Because the impurity regions 111 and the conductive connection pattern 310 are formed in a single process, the dopants included in the conductive connection pattern 310 may include the same element of the dopants included in the impurity regions 111. According to exemplary embodiments, it may be possible to simplify the formation of the impurity regions 111 and the conductive connection pattern 310. Subsequently, the fourth mask pattern 940 may be removed.

Figure 8G:
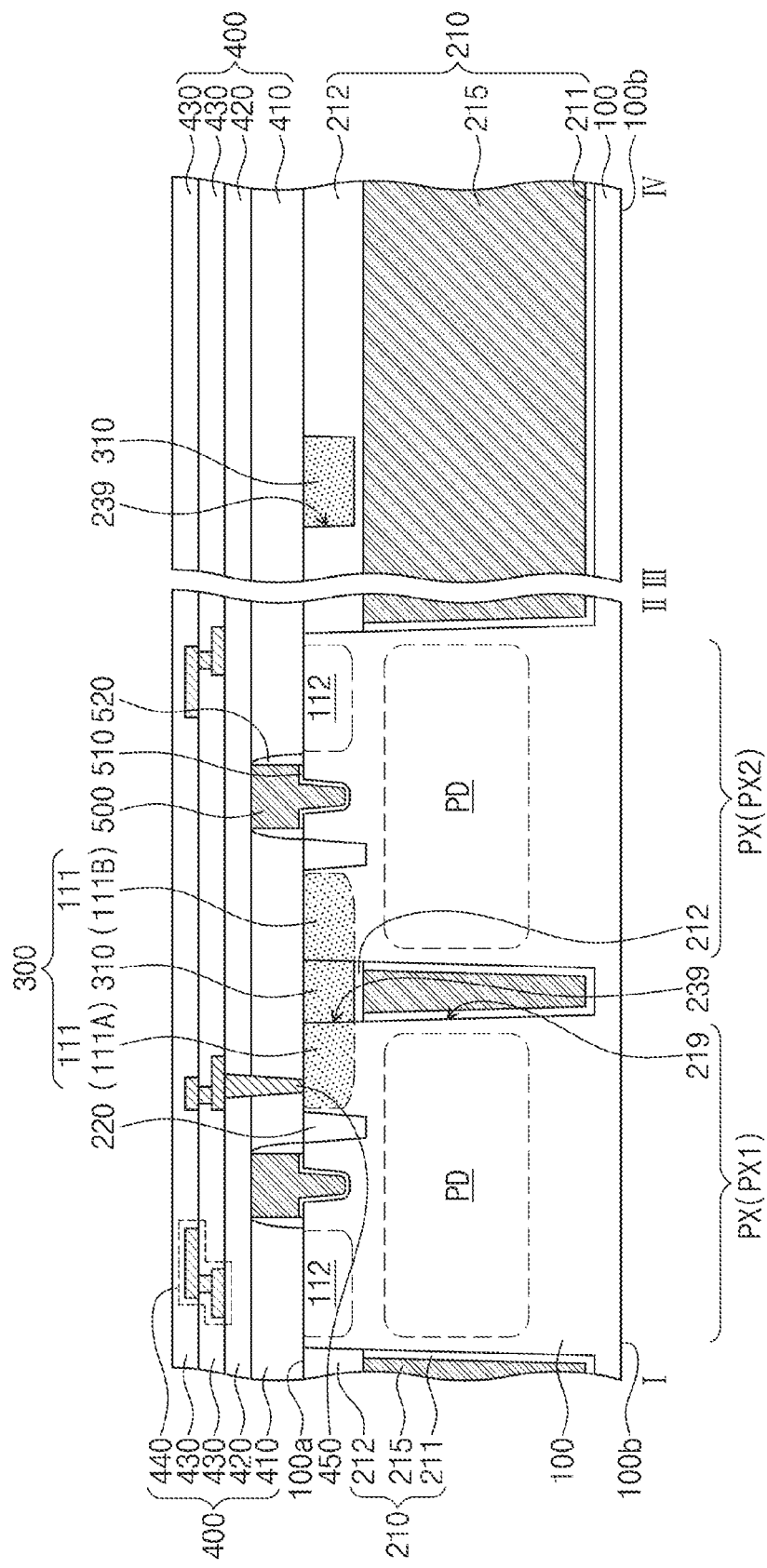

Referring to FIG. 8G, the substrate 100 may be implanted with second conductive type impurities to form a doping region 112. Differently from that shown, the doping region 112 may be formed before or simultaneously with the formation of the impurity regions 111 of FIG. 8F.

A gate dielectric pattern 510 and a gate pattern 500 may be formed on each pixel region PX. On the first surface 100a of the substrate 100, a gate spacer 520 may be formed on sidewalls of the gate pattern 500.

A first dielectric layer 410 may be formed on the first surface 100a of the substrate 100, thereby covering top surfaces of the impurity regions 111, top surfaces of the doping regions 112, a top surface of the conductive connection pattern 310, and an outer sidewall of the gate spacer 520. The first dielectric layer 410 may expose a top surface of the gate pattern 500. A second dielectric layer 420 may be formed on the first dielectric layer 410 and the gate pattern 500. A contact plug 450 may be formed to penetrate the first dielectric layer 410 and the second dielectric layer 420. In another example, the contact plug 450 does not penetrate the second dielectric layer 420. A third dielectric layer 430 may be formed on the second dielectric layer 420. Wiring patterns may be formed between the second dielectric layer 420 and the third dielectric layer 430. A via may be formed in the third dielectric layer 430. The formation of the wiring patterns and the via may fabricate a wiring structure 440. The wiring structure 440 may include the via and the wiring patterns. The formation of the wiring patterns, the third dielectric layer 430, and the via may be performed repeatedly. Therefore, a plurality of third dielectric layers 430, a plurality of wiring patterns, and a plurality of vias may be formed.

Figure 8H:
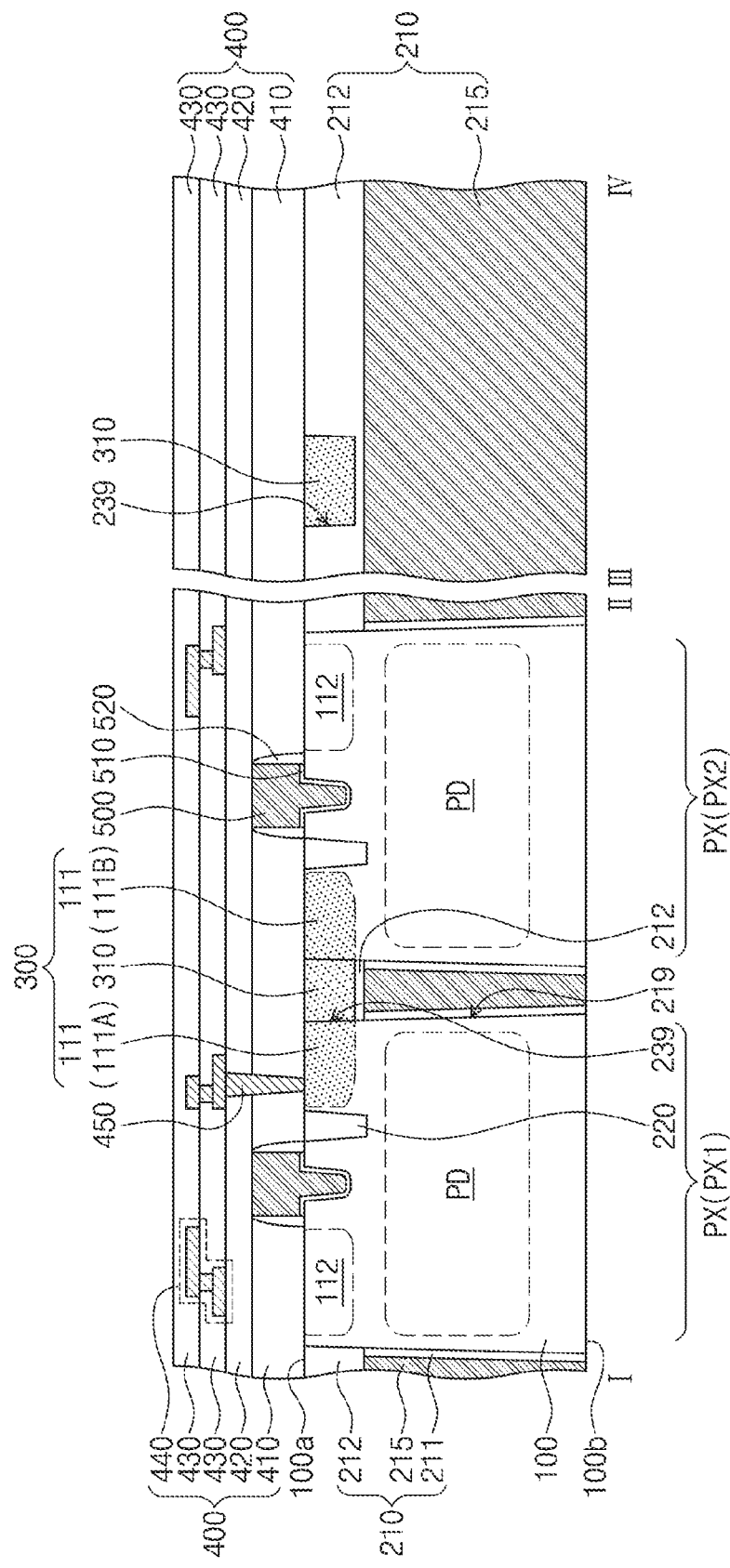

Referring to FIG. 8H, a thinning process may be performed on a second surface 100b of the substrate 100. The thinning process may include, for example, a grinding process or a chemical mechanical polishing process. As a result of the thinning process, the isolation pattern 210 may be exposed on the second surface 100b of the substrate 100. For example, the conductive isolation pattern 215 may be exposed on the second surface 100b of the substrate 100.

Referring back to FIGS. 2B and 2D, a conductive terminal 217 may be formed on the second surface 100b of the thinned substrate 100, and may be coupled to the conductive isolation pattern 215. A backside dielectric layer 600 may be formed on the second surface 100b of the thinned substrate 100, thereby covering a bottom surface of the isolation pattern 210 and the second surface 100b of the substrate 100. Color filters CF, a grid pattern 650, and micro-lenses 700 may be formed on a bottom surface of the backside dielectric layer 600. The image sensor 1 described with reference to FIGS. 2A to 2D may be fabricated through the processes described above.

In exemplary embodiments, differently from that described above, the impurity implantation process of FIG. 8F may include implanting first conductive type impurities, and the formation of the contact plug 450 of FIG. 8G is not performed. In this case, the image sensor 2 described above with reference to FIGS. 3A and 3B may be fabricated, or the image sensor 4 described above with reference to FIGS. 4A and 4B may be fabricated.

FIGS. 9A to 9D illustrate cross-sectional views taken along lines I-II and III-IV of FIG. 2A, showing a method of fabricating an image sensor according to exemplary embodiments. The description of FIGS. 9A to 9D also refers to FIG. 2A. For convenience of explanation, a further description of elements and technical aspects previously described may be omitted below.

Figure 9A:
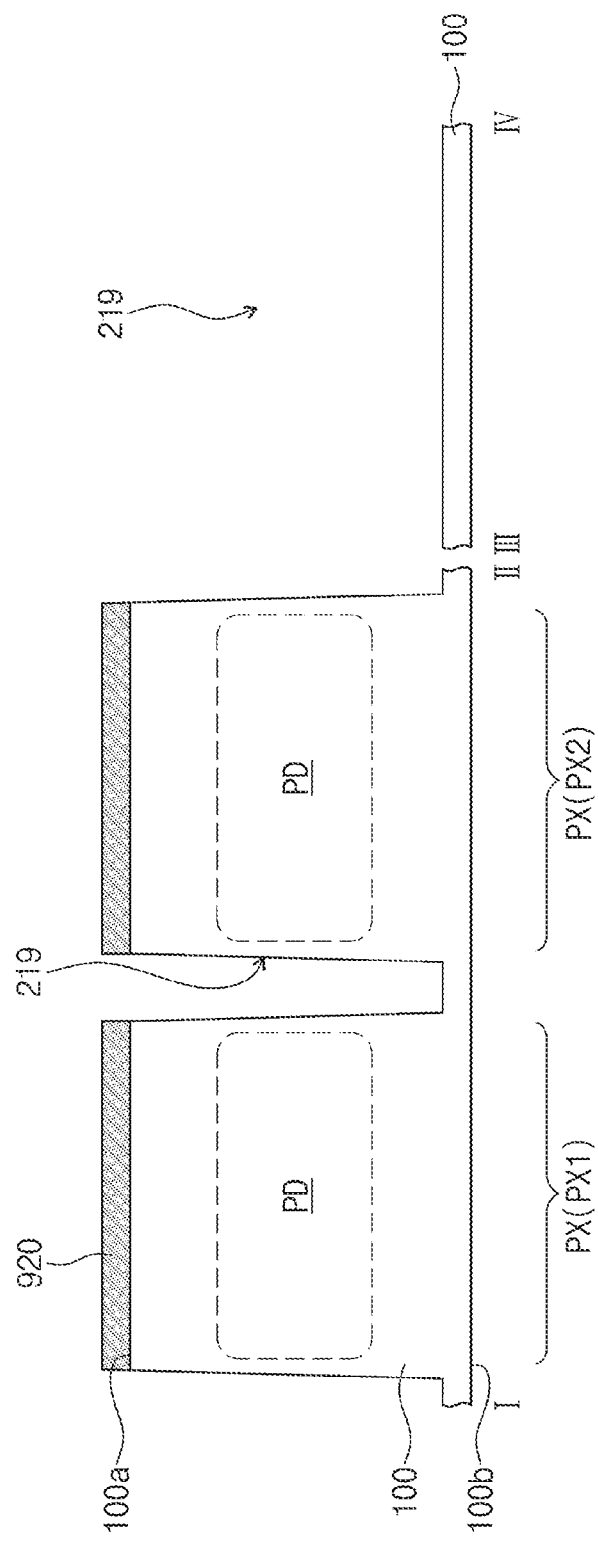
FIGS. 9A to 9D illustrate cross-sectional views showing a method of fabricating an image sensor according to exemplary embodiments.

Referring to FIG. 9A, the photoelectric conversion region PD may be formed in the substrate 100. The second mask pattern 920 may be formed on the first surface 100a of the substrate 100. The formation of the second mask pattern 920 may include coating a preliminary mask pattern on the substrate 100, and using a photomask to perform exposure and development processes on the preliminary mask pattern. An etching process may be performed in which the second mask pattern 920 is used to form the second trench 219 in the substrate 100 between the pixel regions PX. Subsequently, the second mask pattern 920 may be removed.

Figure 9B:
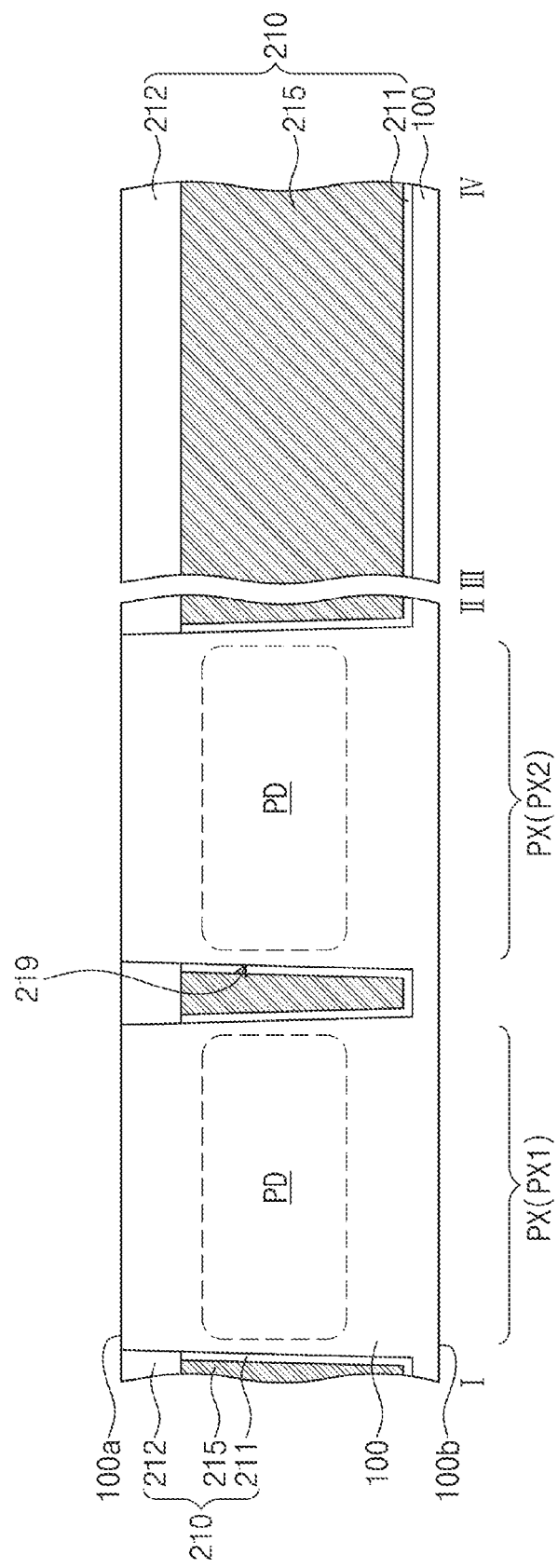

Referring to FIG. 9B, the first dielectric isolation pattern 211 and the conductive isolation pattern 215 may be formed in the second trench 219. The second dielectric isolation pattern 212 may be formed on the first dielectric isolation pattern 211 and the conductive isolation pattern 215, thereby filling the second trench 219. Therefore, the isolation pattern 210 may be fabricated. The formation of the first dielectric isolation pattern 211, the conductive isolation pattern 215, and the second dielectric isolation pattern 212 may be substantially the same as that described above with reference to FIGS. 8C and 8D.

Figure 9C:
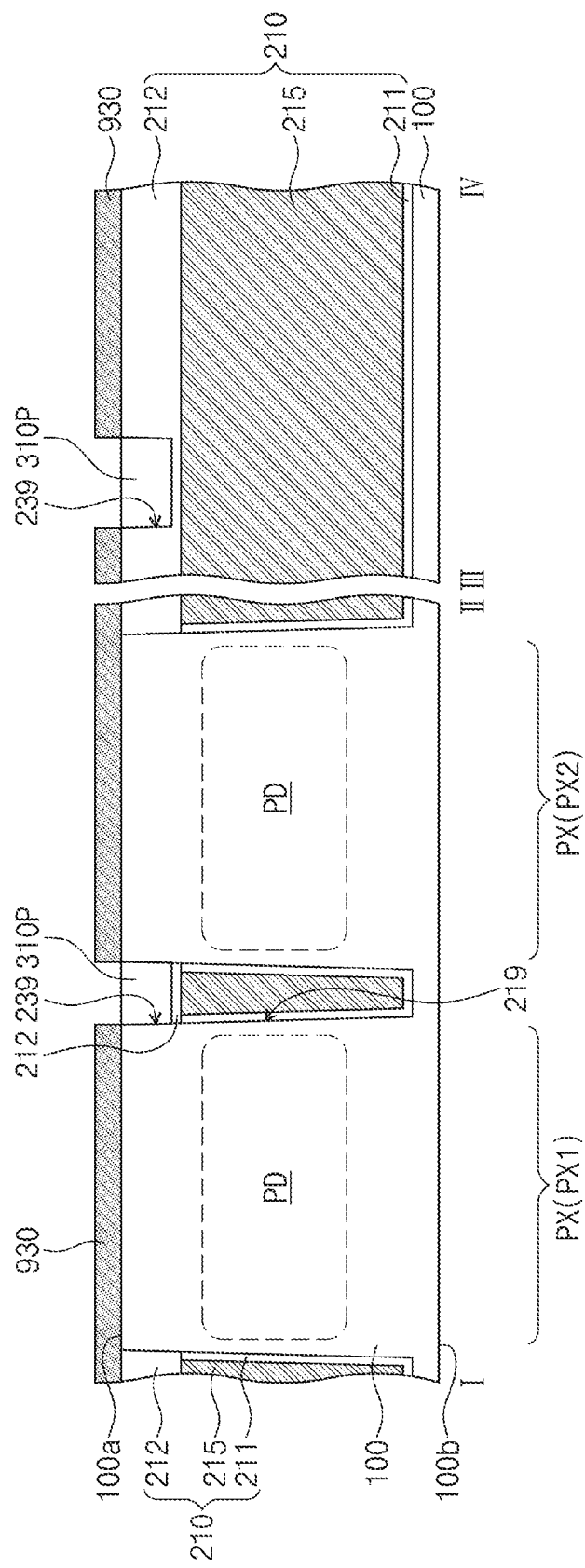

Referring to FIG. 9C, the third mask pattern 930 may be formed on the second dielectric isolation pattern 212 and the first surface 100a of the substrate 100. The second dielectric isolation pattern 212 may be removed at its portion exposed by the third mask pattern 930, and thus, the third trench 239 may be formed. The third trench 239 may expose the second dielectric isolation pattern 212 and an inner sidewall of the substrate 100. The preliminary conductive connection pattern 310P may be formed in the third trench 239. The formation of the third mask pattern 930, the third trench 239, and the preliminary conductive connection pattern 310P may be substantially the same as that described above with reference to FIG. 8E.

Figure 9D:
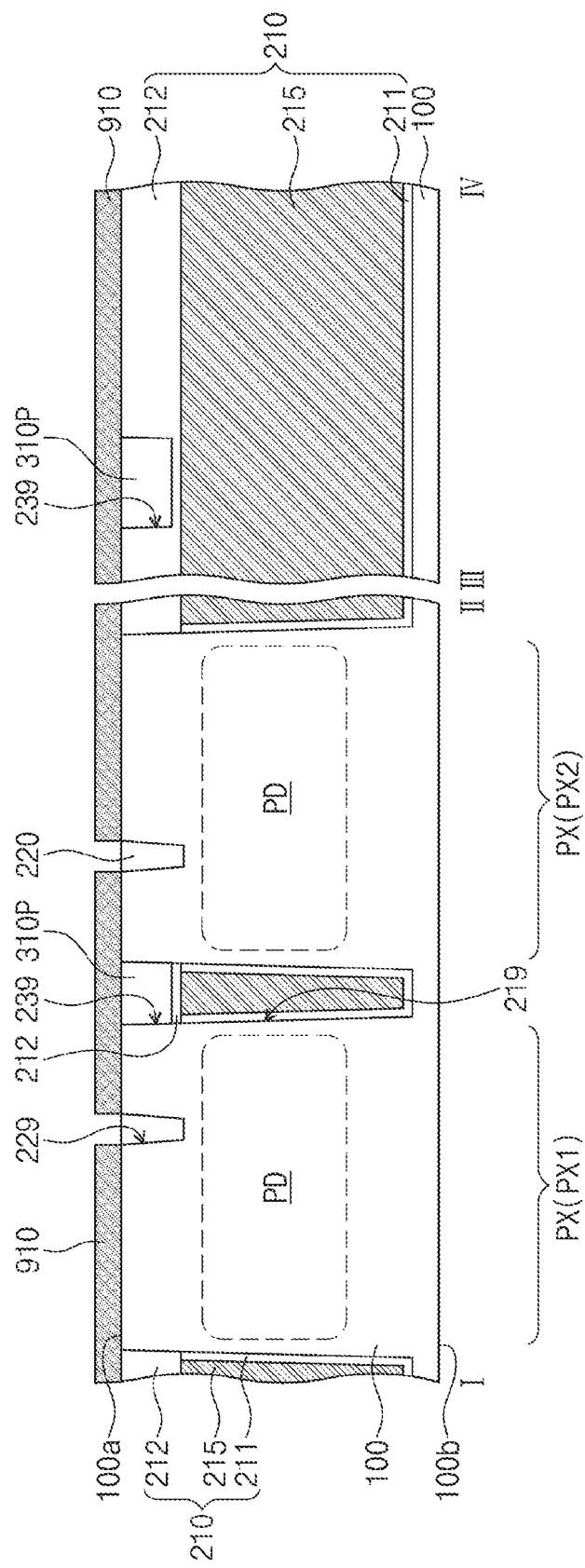

Referring to FIG. 9D, the first mask pattern 910 may be formed on the first surface 100a of the substrate 100, the second dielectric isolation pattern 212, and the preliminary conductive connection pattern 310P. An etching process may be performed in which the first mask pattern 910 is used to form the first trench 229 in the substrate 100. Subsequently, the first mask pattern 910 may be removed. The first trench 229 may be filled with a dielectric material to form the device dielectric pattern 220. The formation of the first mask pattern 910, the first trench 229, and the device dielectric pattern 220 may be substantially the same as that described above with reference to FIGS. 8A and 8B.

Referring again to FIG. 8F, the fourth mask pattern 940 may be formed on the first surface 100a of the substrate 100. The preliminary conductive connection pattern 310P and a portion of the first surface 100a of the substrate 100 may undergo an impurity implantation process in which the fourth mask pattern 940 is used to form the impurity regions 111 and the conductive connection pattern 310. The formation of the impurity regions 111 and the conductive connection pattern 310 may fabricate the share structure 300. Subsequently, the fourth mask pattern 940 may be removed.

Referring again to FIG. 8G, the substrate 100 may be implanted with second conductive type impurities to form the doping regions 112. In exemplary embodiments, differently from that shown, the formation of the doping regions 112 may be followed by the formation of the impurity regions 111. The gate dielectric pattern 510, the gate pattern 500, and the gate spacer 520 may be formed on each pixel region PX.

The first dielectric layer 410, the second dielectric layer 420, the third dielectric layers 430, and the wiring structure 440 may be formed on the first surface 100a of the substrate 100, thereby forming the interconnection layer 400. The contact plug 450 may be formed in the first dielectric layer 410, and may be coupled to the impurity regions 111 or the conductive connection pattern 310.

Referring again to FIG. 8H, a thinning process may be performed on the second surface 100b of the substrate 100, such that the conductive isolation pattern 215 may be exposed on the second surface 100b of the substrate 100.

Referring again to FIG. 2B, the conductive terminal 217, the backside dielectric layer 600, the color filters CF, the grid pattern 650, and the micro-lenses 700 may be formed on the second surface 100b of the substrate 100. The image sensor 1 described with reference to FIGS. 2A to 2D may be fabricated through the processes described above.

The impurity implantation process described with reference to FIG. 8F may include implanting first conductive type impurities, and in exemplary embodiments, the formation of the contact plug 450 of FIG. 8G is not performed. In this case, the image sensor 2 described with reference to FIGS. 3A and 3B may be fabricated, or the image sensor 4 described with reference to FIGS. 4A and 4B may be fabricated.

According to exemplary embodiments of the present inventive concept, a conductive connection pattern may be provided between and electrically connected to impurity regions of two adjacent pixel regions. Accordingly, it may be possible to simplify components of an image sensor and to more freely design the components of the image sensor. As a result, the image sensor may become compact-sized.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An image sensor, comprising:
a substrate having a first surface and a second surface facing away from each other;
a plurality of photoelectric conversion regions disposed in the substrate;
an isolation pattern disposed in the substrate between the photoelectric conversion regions;
a conductive connection pattern disposed on the isolation pattern and in a trench, the trench penetrating the first surface of the substrate; and
a first impurity region disposed in the substrate and adjacent to the first surface of the substrate,
wherein a first sidewall of the conductive connection pattern is in contact with the first impurity region,
wherein a dopant included in the conductive connection pattern includes a same element as an impurity doped in the first impurity region.

2. The image sensor of claim 1, further comprising:
a second impurity region in contact with a second sidewall of the conductive connection pattern, the second sidewall facing the first sidewall,
wherein the dopant included in the conductive connection pattern includes the same element as an impurity doped in the second impurity region.

3. The image sensor of claim 2, wherein
the substrate includes a first pixel region and a second pixel region that are defined by the isolation pattern,
the first impurity region is disposed in the first pixel region, and
the second impurity region is disposed in the second pixel region of the substrate.

4. The image sensor of claim 3, wherein each of the first impurity region and the second impurity region includes a ground region.

5. The image sensor of claim 3, wherein each of the first impurity region and the second impurity region includes a floating diffusion region.

6. The image sensor of claim 3, further comprising:
a first gate pattern disposed on the first surface of the substrate in the first pixel region; and
a second gate pattern disposed on the first surface of the substrate in the second pixel region,
wherein, in a plan view, the conductive connection pattern is disposed between the first gate pattern and the second gate pattern,
wherein, in the plan view, the first impurity region is disposed between the first gate pattern and the conductive connection pattern,
wherein, in the plan view, the second impurity region is disposed between the second gate pattern and the conductive connection pattern.

7. The image sensor of claim 2, wherein the conductive connection pattern is electrically connected to the first impurity region and the second impurity region.

8. The image sensor of claim 1, wherein the isolation pattern comprises:
a conductive isolation pattern; and
a dielectric isolation pattern disposed on a sidewall and a top surface of the conductive isolation pattern,
wherein the conductive connection pattern vertically overlaps the conductive isolation pattern.

9. The image sensor of claim 8, wherein the conductive connection pattern is electrically insulated from the conductive isolation pattern.

10. The image sensor of claim 1, wherein a width of the isolation pattern at the second surface of the substrate is between about 0.03 μm and about 0.08 μm.

11. An image sensor, comprising:
a substrate having a first surface and a second surface facing away from each other;
an isolation pattern penetrating the substrate and defining a plurality of pixel regions;
a conductive connection pattern disposed in a trench penetrating the first surface of the substrate, the conductive connection pattern disposed on the isolation pattern; and
a plurality of impurity regions disposed in the substrate and adjacent to the first surface of the substrate,
wherein the impurity regions comprise:
a first impurity region in contact with a first sidewall of the conductive connection pattern; and
a second impurity region in contact with a second sidewall of the conductive connection pattern, the second sidewall facing the first sidewall,
wherein the conductive connection pattern includes a doped semiconductor material.

12. The image sensor of claim 11, wherein a dopant included in the conductive connection pattern includes a same element as an impurity doped in the first and second impurity regions.

13. The image sensor of claim 11, wherein the isolation pattern comprises:
a dielectric isolation pattern; and
a conductive isolation pattern disposed in the dielectric isolation pattern,
wherein the conductive connection pattern vertically overlaps the conductive isolation pattern.

14. The image sensor of claim 11, further comprising:
a contact plug disposed on one of the conductive connection pattern, the first impurity region, and the second impurity region,
wherein the contact plug is electrically connected to the conductive connection pattern, the first impurity region, and the second impurity region.

15. The image sensor of claim 11, further comprising:
a wiring pattern disposed on the isolation pattern,
wherein the wiring pattern is connected to a third sidewall of the conductive connection pattern,
wherein the third sidewall neighbors the first sidewall and the second sidewall.

16. An image sensor, comprising:
a substrate having a first surface and a second surface facing away from each other;
an isolation pattern defining a first pixel region and a second pixel region in the substrate;
a photoelectric conversion region disposed in each of the first and second pixel regions in the substrate;
a first impurity region disposed in the first pixel region of the substrate and adjacent to the first surface of the substrate;
a second impurity region disposed in the second pixel region of the substrate and adjacent to the first surface of the substrate;
a conductive connection pattern disposed between the first impurity region and the second impurity region, the conductive connection pattern disposed in a trench penetrating the first surface of the substrate;
a gate pattern disposed on the first surface of the substrate and spaced apart from the conductive connection pattern;
a gate dielectric pattern disposed between the substrate and the gate pattern;
an interconnection layer disposed on the first surface of the substrate, the interconnection layer including a plurality of dielectric layers and a wiring structure;
a color filter disposed on the second surface of the substrate; and
a micro-lens disposed on the color filter,
wherein the isolation pattern includes a dielectric isolation pattern and a conductive isolation pattern disposed in the dielectric isolation pattern,
wherein the conductive connection pattern vertically overlaps the conductive isolation pattern,
wherein the conductive connection pattern is in physical contact with and is electrically connected to the first impurity region and the second impurity region.

17. The image sensor of claim 16, wherein the conductive connection pattern includes a doped semiconductor material.

18. The image sensor of claim 16, wherein a dopant included in the conductive connection pattern includes a same element as an impurity doped in the first and second impurity regions.

19. The image sensor of claim 16, wherein
the first impurity region includes a ground region, and
the second impurity region includes a ground region.

20. The image sensor of claim 16, wherein
the dielectric isolation pattern is disposed between the conductive connection pattern and the conductive isolation pattern, and
the conductive connection pattern is electrically insulated from the conductive isolation pattern.

* * * * *